(12) United States Patent
Yassour et al.

(10) Patent No.: US 7,603,028 B2
(45) Date of Patent: Oct. 13, 2009

(54) NON-CONTACT THERMAL PLATFORMS

(75) Inventors: Yuval Yassour, Kibbutz Hasolelim (IL); Arie Harnik, Haifa (IL); Hilel Richman, Haifa (IL)

(73) Assignee: Coreflow Scientific Solutions Ltd., Yokneam (IL)

( * ) Notice: Subject to any disclaimer, the term of this patent is extended or adjusted under 35 U.S.C. 154(b) by 463 days.

(21) Appl. No.: 10/592,763

(22) Filed: Sep. 14, 2006

(65) Prior Publication Data

US 2008/0145190 A1 Jun. 19, 2008

Related U.S. Application Data

(60) Provisional application No. 60/553,546, filed on Mar. 17, 2004.

(51) Int. Cl.
- B05B 1/24 (2006.01)
- C23C 16/00 (2006.01)
- A47J 45/00 (2006.01)
- B65G 25/00 (2006.01)

(52) U.S. Cl. .................. 392/477; 118/725; 294/64.3; 414/147

(58) Field of Classification Search .............. 392/477, 392/473, 474, 475, 476; 239/128, 129, 130, 239/131, 132, 133, 134, 135, 136, 137, 138, 239/139; 138/7, 38, 39, 40, 41, 42, 43, 45, 138/463; 294/64.1, 64.3; 118/725, 724, 118/726; 414/147

See application file for complete search history.

(56) References Cited

U.S. PATENT DOCUMENTS 3,661,117 A * 5/1972 Cornelius et al. ........... 118/724
4,533,820 A * 8/1985 Shimizu ..................... 219/411
5,180,000 A * 1/1993 Wagner et al. ............. 165/80.1
5,255,286 A * 10/1993 Moslehi et al. ............. 374/121
5,490,728 A * 2/1996 Schietinger et al. ........... 374/7
5,830,277 A * 11/1998 Johnsgard et al. ........... 118/725
2002/0000198 A1* 1/2002 Ishikawa et al. ............ 118/715

FOREIGN PATENT DOCUMENTS

| WO | WO 01/14752 | 3/2001 |
| WO | WO 01/14782 | 3/2001 |
| WO | WO 01/19572 | 3/2001 |
| WO | WO 03/060961 | 7/2003 |

* cited by examiner

Primary Examiner—Daniel L Robinson
(74) Attorney, Agent, or Firm—Pearl Cohen Zedek Latzer, LLP

(57) ABSTRACT

A thermal treatment system comprising at least one apparatus for thermally treating an object, the apparatus comprising: one platform or two substantially opposite platforms, where at least one of the platforms has at least one thermal means for heating or cooling of the object; and at least one of the platforms has fluid-mechanical means for supporting the object without contact. The platform has an active surface comprising at least one of a plurality of basic cells, each basic cell having at least one of a plurality of pressure outlets and at least one of a plurality of fluid-evacuation channels. At least one of the pressure outlets of each basic cell is fluidically connected through a flow restrictor to a high-pressure fluid supply, the pressure outlets providing pressurized fluid for maintaining a fluid-cushion between the object and the active-surface of the platform. The flow restrictor characteristically exhibits fluidic return spring behavior. Each of the evacuation channels has an inlet and outlet, for locally balancing mass flow for the basic cells.

56 Claims, 11 Drawing Sheets

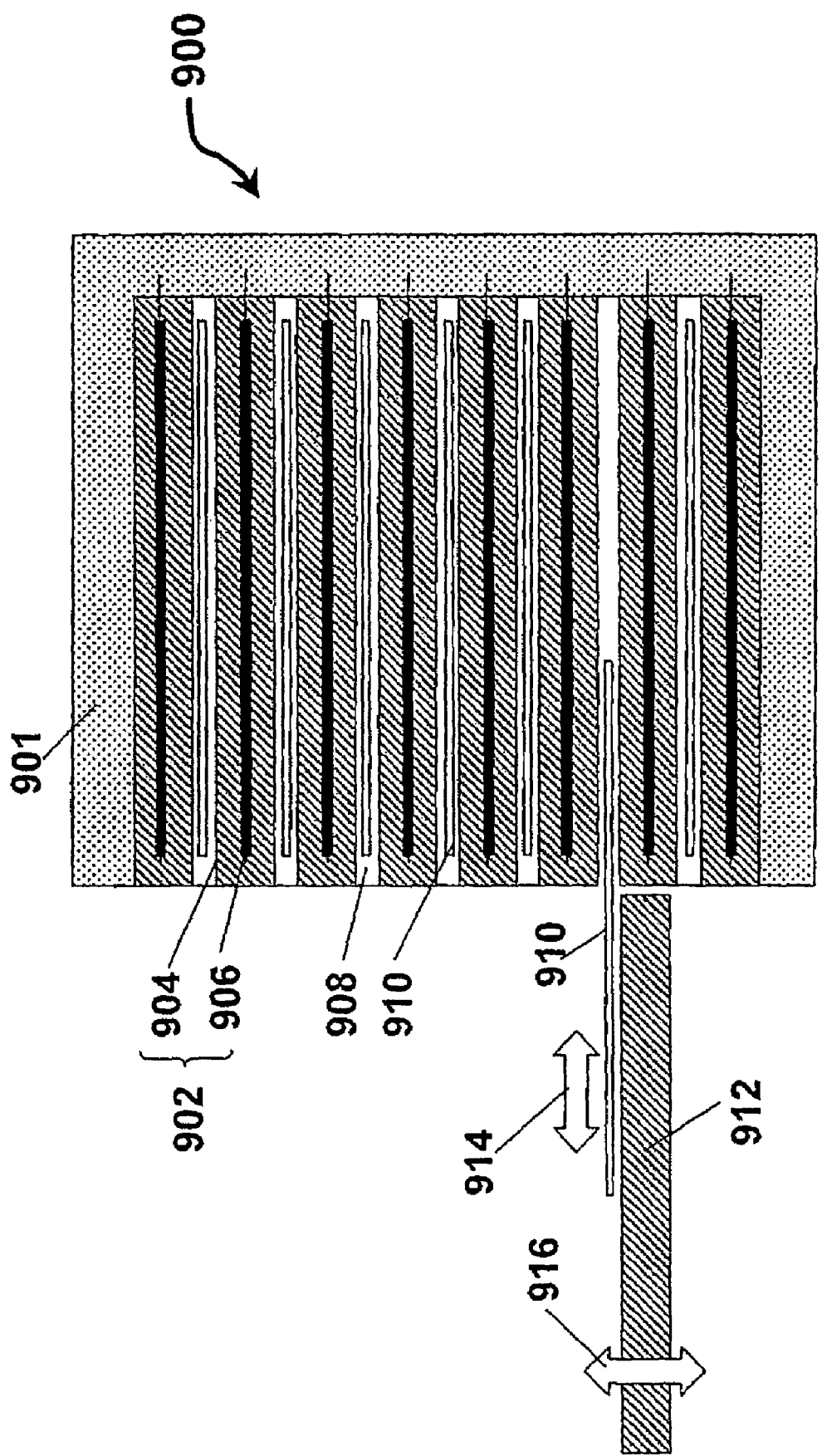

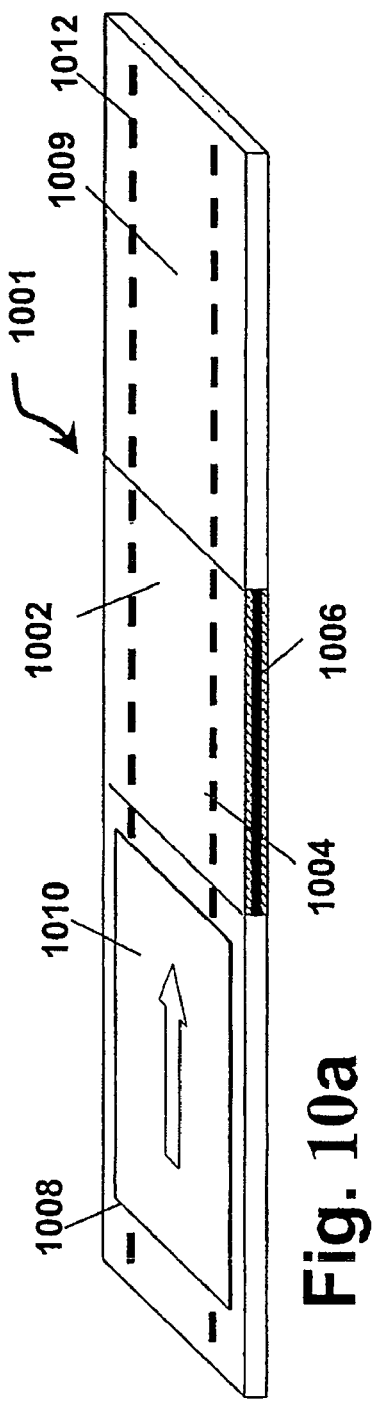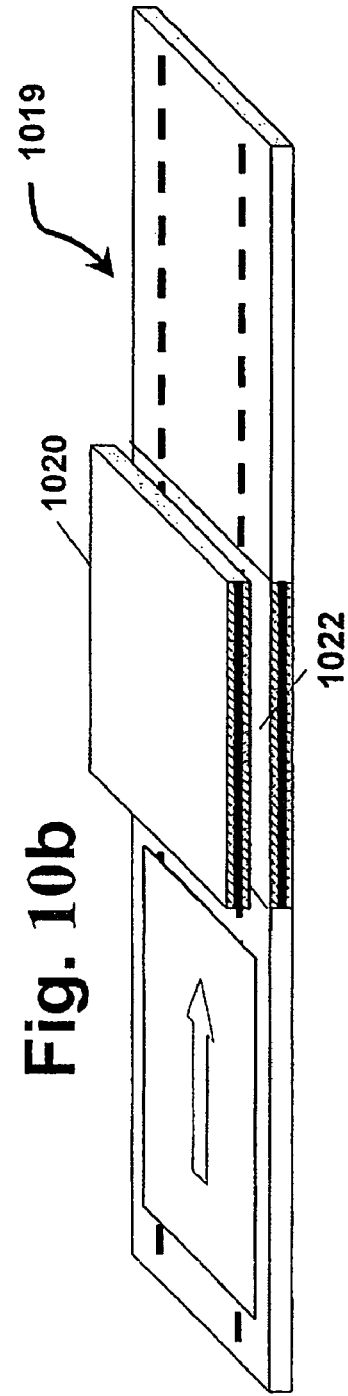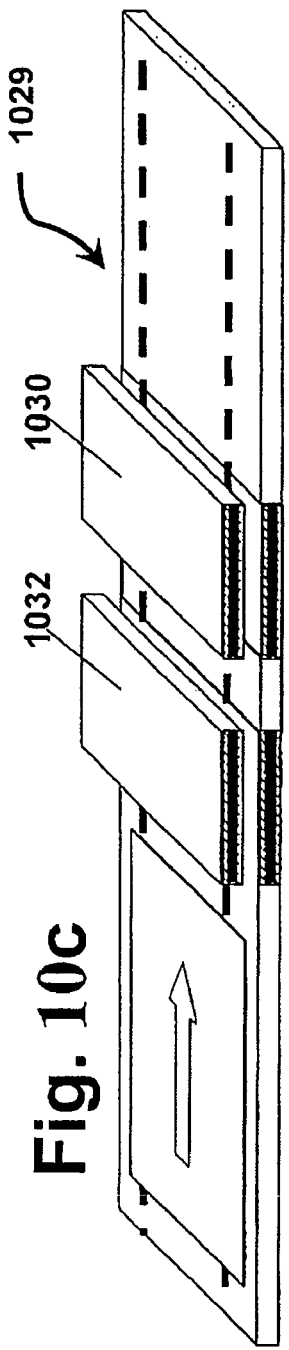

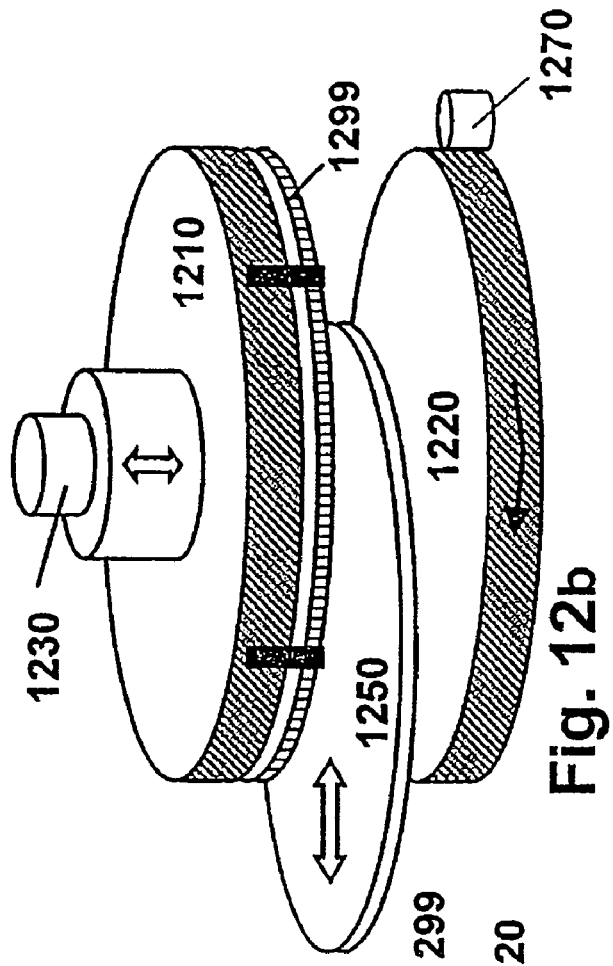
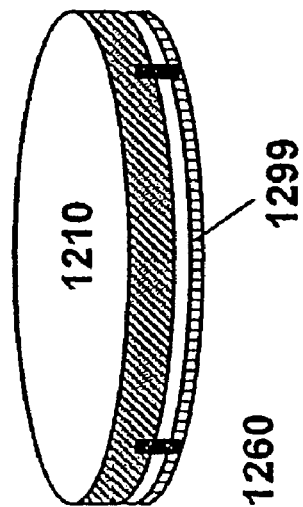
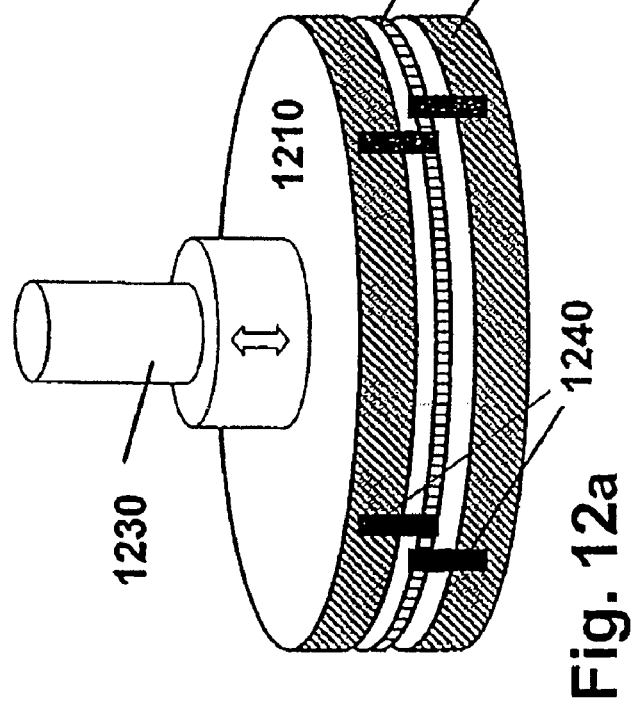
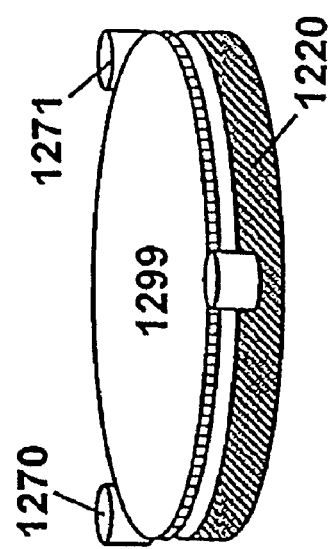
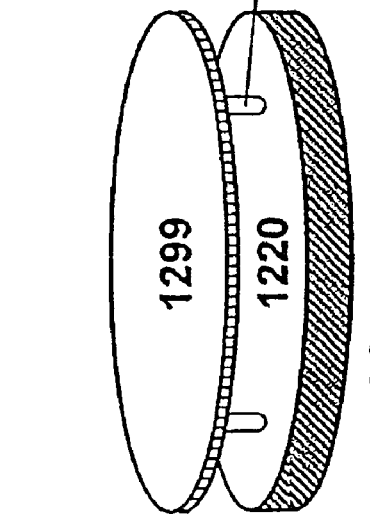

US 7,603,028 B2

NON-CONTACT THERMAL PLATFORMS

CROSS-REFERENCE TO RELATED APPLICATIONS

This application is a National Phase Application of PCT International Application No. PCT/IL2005/000299, entitled "Non-Contact Thermal Platforms", International Filing Date Mar. 16, 2005, published on Sep. 22, 2005 as International Publication Number WO 2005/086588; which in turn claims priority from U.S. Provisional Patent Application No. 60/553, 546, filed on Mar. 17, 2004, both of which are incorporated herein by reference in their entirety.

FIELD OF THE INVENTION

The invention relates to Thermal-treatment apparatus and method, and to non-contact support platforms.

BACKGROUND OF THE INVENTION

A Semi-Conductor (SC) wafer may be heated or cooled, for example, as part of a deposition process, a baking process, or a thermal degas process, as are known in the art. Similar processes are applied at the FPD (Flat Panel Display) manufacturing lines. However such a thermal-treatment examples are not limited to the Wafers or the FPD substrate but to any other object, flat or not, thin or not.

Current systems for heating or cooling a wafer may place the wafer in contact with a surface of a chuck, which may be heated to a desired temperature. Thus, the heat may be transferred to the wafer via contact with the chuck, i.e., via a conductive heat transfer mechanism.

A relatively long "raise-up" time period may be required in order to bring the chuck to a steady state temperature. Thus, since increasing/decreasing the temperature of the chuck may require a relatively long time period, it may be required to use several pre-heated chucks in a process requiring applying different temperatures to the wafer.

The distribution of the temperature of the wafer may not be homogeneous due to hot or cold spots, which may occur as a result of at least partial contact between the chuck and the wafer. Irregularities on the surface of the wafer being in contact with the chuck may also result in non-homogeneous heating or cooling of the wafer.

Furthermore, the contact between the wafer and the chuck may result in damages, e.g., backside contamination and/or Electro Static Damage (ESD) to the wafer. Slippage between the wafer and the chuck, resulting in backside contamination and/or scratches, may occur due to thermal expansion or contraction of wafer during heating or cooling.

BRIEF DESCRIPTION OF THE INVENTION

A thermal treatment system comprising at least one apparatus for thermally treating an object, the apparatus comprising:
at least one of a pair of substantially opposite platforms, where at least one of the platforms having at least one thermal means for heating or cooling of the object; and at least one of the platforms has fluid-mechanical means for supporting the object without contact, the platform having an active surface comprising at least one of a plurality of basic cells, each basic cell having at least one of a plurality of pressure outlets and at least one of a plurality of fluid-evacuation channels, at least one of the pressure outlets of each basic cell being fluidically connected through a flow restrictor to a high-pressure fluid supply, the pressure outlets providing pressurized fluid for maintaining a fluid-cushion between the object and the active-surface of the platform, the flow restrictor characteristically exhibiting fluidic return spring behavior; each of said at least one of a plurality of fluid-evacuation channels having an inlet and outlet, for locally balancing mass flow for said at least one of a plurality of basic cells.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features and advantages thereof, may best be understood by reference to the following detailed description when read with the accompanied drawings in which:

FIG. 9 is a schematic illustration of a multi-chamber non-contact thermal system, in accordance with some exemplary embodiments of the invention; and FIGS. 10a-10c are schematic illustrations of three, respective, in line non-contact thermal systems according to some exemplary embodiments of the invention.

FIGS. 12a-12e are schematic illustrations of optional circular thermal treatment apparatuses It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF EMBODIMENTS OF THE INVENTION

Figure 1:
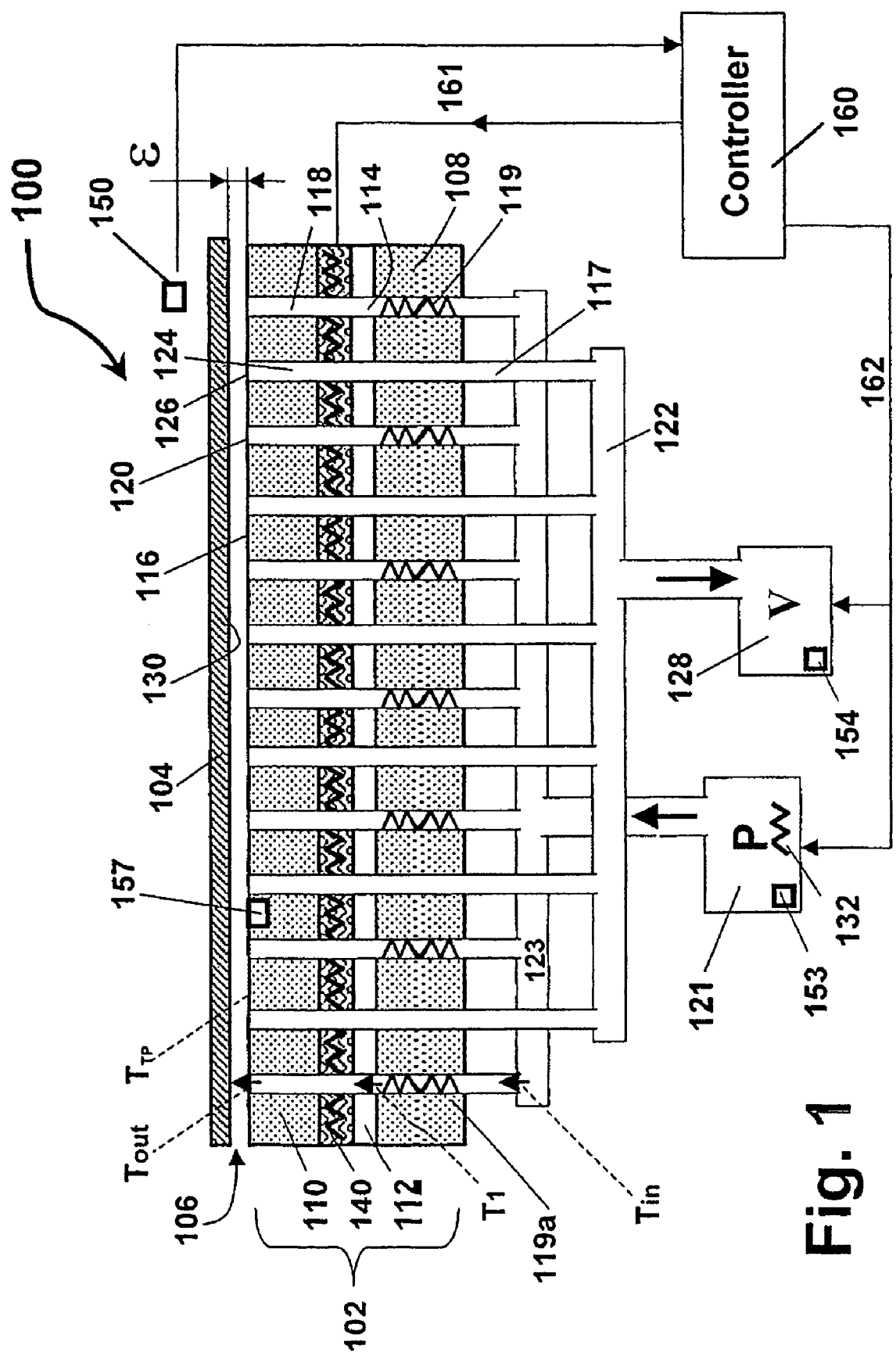
FIG. 1 is a schematic, cross-section illustration of a non-contact thermal system including a thermal platform configuration, according to an exemplary embodiment of the invention.

In the following detailed description, numerous specific details are set forth in order to provide a thorough understanding of the invention. However, it will be understood by those of ordinary skill in the art that the present invention may be practiced without these specific details. In other instances, well-known methods, procedures, components and circuits have not been described in detail so as not to obscure the present invention.

Embodiments of the present invention provide a device, system and method for heating/cooling an object, e.g., a Semi-Conductor (SC) wafer, while the object is supported by a non-contact support platform, which is adapted to support the object without contact, for example, by fluid-cushion induced forces, as described below.

It is appreciated that for the purpose of the present invention the term "supporting" may also mean "clamping" (hereinafter referred to as: "supporting" or "clamping"), depending on the relevant context.

Significant configurations of non-contact supporting platforms are cases where the fluid-cushion is provided by an "active" surface of a platform facing the object over it and supporting it without motion or while conveying it over that platform without contact. Without derogating the generality, in most cases this configuration is usually referred to, but other possible configurations where the platform is passive and the fluid-cushion is generated by a floating object having its own "active surface" that generates the fluid-cushion are considered to be covered by the present invention, for example a bridge that apply a thermal-treatment as it is traveling over a flat substrate such as FPD and supported be an fluid-cushion that is created between the top-surface of that substrate and the opposing active surface of that bridge. Hereinafter, this second configuration is referred to as the "self supported bridge configuration".

Non-contact platforms or handing and conveying equipments make use of various types of fluid-cushions. A single aerodynamic building block links the various types of fluid-cushions, namely the usage of a plurality of fluidic return springs such as SASO nozzle to established a high performance non-contact platform. It is asserted that for better performance of fluid-cushion support systems, with respect to thermal treatment uniformity, it is important to establish a local balance fluid-cushion by locally evacuating the fluid from the entire area of the platform "active surface". Without derogating the generality, several types of fluid-cushions are mentioned herein, each creates the local evacuation of fluid at a different manner:

Pressure-Atmosphere (PA) Type of Fluid-cushion

PA-type fluid-cushion is generated using an active surface with a plurality of pressure ports, and evacuation channels, where fluid is allowed to evacuate into the surroundings. The PA-type fluid-cushion is preloaded by the object weight, where an object is supported by the non-contact platform that balances the gravity forces. The PA-type platform provides locally-balanced non-contact support in both cases where the object, that in common cases is flat and/or thin and/or of wide-format with respect to its thickness, is stationary supported, or while it conveyed by any drive mechanism. The lateral dimensions of the object are usually much larger than the dimensions of the "basic cell" of the PA-platform to be discussed hereafter. "Body-weight preloading" means that fluid-dynamic stiffness (to be referred hereafter by FD-stiffness), of the PA-type fluid-cushion at a predetermined equilibrium floating gap (to be referred hereafter as the fluid-cushion nominal gap, denoted by en), depends on the object weight. "FD-stiffness" means the amount of force that is developed by the fluid-cushion in a self-adaptive manner, when trying to change the nominal gap (between the lower surface of the object and the active-surface of the non-contact platform). The FD-stiffness is measured, for the purposes of the present invention, in terms of grams/cm$^2$/μm.

PA-type fluid-cushion is generated in a narrow gap between the active surface of the platform and the pacing surface of the supported object. The fluid is introduced to the fluid-cushion by a plurality of pressure ports, provided with flow restrictors, such as SASO nozzles, preferably arranged in two dimensional manner or optionally at a mixed repeatable format with a plurality of evacuation holes, through which excessive fluid evacuates into a reservoir kept at atmospheric pressure. The dimensions of the basic cell are selected with respect to the lateral dimensions of the object to be levitated, and in general it is desired that the resolution of the pressure ports and evacuation channels (all termed herein as holes) be such that at any given time a plurality of holes is covered by the levitated object. To obtain uniform support of local nature, it is preferable that a plurality of basic-cells, each the basic cells is of local balance nature with respect to mass flow balance, will be distributed in two-dimensional manner to support the object. It has to be emphasized that the "resistor-symbol" used for the flow-restrictor in the accompanying drawings is only of symbolic meaning and the embodiment details of the flow-restrictors such as the preferred SASO-nozzles (see FIG. 17) were described in WO 01/14782, WO 01/14752 and WO 01/19572, all incorporated herein by reference. Other flow restrictors that exhibit the same characteristics may be also used.

A PA-type non-contact platform is preloaded by the object bodyweight. In general, as the pressure introduced to the fluid-cushion is higher, the FD-stiffness is intensified. It means that a well-functioning non-contact platform in terms of fluid-cushion stiffness, a stable and easy to-controlled platform, is obtained when the object is heavy, and relatively high driven pressure has to be introduced to the fluid-cushion in order to balance gravity. However it is mostly important that a PA-type fluid-cushion will operate at high driven pressure with respect to the weight of object per area when supporting a thin substrates such as silicon wafers or FPD having a weight of about 0.2 gram per square cm. The PA-type fluid-cushion can operate, for example, at 100 milibars driven pressure, a value that is 500 times larger with respect to the above mentioned substrates weight. It can be achieve by special design of the basic cell where local evacuation holes dramatically reduces the fluid-cushion support at the nominal fluid-cushion gap, and the most of the supply pressure is dropped inside the flow restrictor, but when such a substrate is forced, by any dynamic or static force, to move toward the active surface of the non-contact platform, huge return forces with respect to the weight of such substrate are developed against this motion and protect it very intensively and fast from any harmed contact.

Pressure-Vacuum (PV) Type Fluid-cushion

PV-type fluid-cushion is a vacuum preloaded fluid cushion generated by an active surface with a plurality of pressure ports, and evacuation outlets connected to a vacuum (means sub-atmospheric pressure) source, thus excessive fluid is evacuated by that vacuum. It is a vacuum preloaded fluid-cushion where the object is accurately supported in rest or conveyed while gripped by the PV-type fluid-cushion. The FD-stiffness of the PV-type fluid-cushion is inherently of bi-directional nature and it may not be depended on the object bodyweight. Bi-directional FD-stiffness means that in both cases when trying to push the abject toward the active-surface of the non-contact platform or when trying to pull it away from that surface, pressure forces that can be much larger than the object bodyweight force the object back, in a self-adaptive manner, to the equilibrium nominal gap. The object dimensions can be much smaller than the active-surface of the platform as mass flow rate is protected by the flow restrictors that are used both at the pressure port and at the evacuation channel (without derogating the generality, in most cases it is not effective to use flow restrictors at the evacuation channels when the platform is fully covered by the substrate). Accordingly we shell refer to the expression active-area as the area on the active-surface of the platform where the object subsists.

PV-type fluid-cushion generally includes two types of conduits, outlets of pressure conduits and outlets of vacuum suction conduits. The pressure conduits are always individually equipped with flow-restrictors, preferably SASO-nozzles, to provide local FRS (Fluidic Return Spring) behavior of the non-contact platform and to secure, by implementing the aerodynamic blockage mechanism, the uniformity of pressure supply in cases where the active surface of the platform is not fully covered. the vacuum conduits can be simple cylindrical hole or optionally, they may also equipped with an individual flow-restrictors such as SASO-nozzles, but it must be of much lower FD-resistance with respect to the pressure flow-restrictors, in order to secure the vacuum level by aerodynamic blockage mechanism in uncovered areas, when the non-contact platform is not fully covered, at least during a potion of the effective operational duration.

It is possible to provide a flow restrictor in the fluid-evacuation channels which are fluidically connected to the ambient atmospheric pressure, without connecting it to a vacuum source, thus in effect the pressure of the fluid-cushion and hence the lifting force under the object are increased. It would be natural to call these flow restrictors "evacuation flow restrictors", but in order to simplify, the term "vacuum flow restrictor is used throughout this specification is refer to evacuation flow restrictors too.

The functionality of the PV-type fluid-cushion, a vacuum preloaded fluid-cushion, is not dependent on gravity. In an equilibrium gripping state ($\epsilon_n$), the object is supported by the PV-type fluid-cushion where the total pressure forces ($\Sigma F_p$), which are developed around each outlet of the pressure restrictor's exits (preferably SASO nozzles), are of the same order of magnitude as the total opposing vacuum forces ($\Sigma F_v$) that are developed around each outlet of the vacuum conduits, which may optionally be equipped with different ("wider" that the pressure flow restrictor) flow-restrictors (preferably SASO nozzles). Both opposing forces may by larger by a factor of 10 or 100 and more from the object bodyweight, and the differential force ($\Sigma F_p - \Sigma F_v$) balances the gravity. In such magnitudes, the functionality of the PV-type fluid-cushion, with respect to FD-stiffness and accordingly to the flatness accuracy performances, is disassociated form the object weight and earth-wise direction of gravity. It has to be emphasize again that the PV-type fluid-cushion has essentially bi-directional FD-stiffness that does not depend on the object weight, and it is a most important property of the PV-type platform, for it means that in both cases when trying to push the object towards the active-surface of the platform or when trying to pull it away, large opposing pressure forces are rapidly developed by the fluid-cushion in a self adaptive and local manner to return it to its equilibrium position.

Similar to the PA-type fluid cushion, the PV-type fluid-cushion is characterized by local balance nature, a significantly important nature with respect to the present invention, as it has a similar basic-cells but the evacuation channels are connected, optionally through flow-restrictors, to a vacuum or sub-atmospheric source to provide intensify evacuation with respect to the PA-type fluid-cushion and to enable to introduced sub-atmospheric pull back forces when to move the object or local portion of it away from the active surface of the platform by external forces. Accordingly the bi-directional FD-stiffness is established Pressure-Preloading (PP) Type Fluid-Cushion PP-type fluid-cushion is a dual sided configuration created by using two opposing active surfaces from both side of an object. Each active surface (similar to the active surface of a PA-type fluid cushion), generating forces that are opposite in direction with respect to the forces of the other active-surface and support for example a flat substrate from its both sides.

Consequently, PP-type fluid-cushion is a pressure preloaded platform, where the object is supported at rest or conveyed with no-contact as FM-forces acting from both its sides, thus PP-type non-contact platform is unconditionally stable. The opposing active-surfaces of the PP-type platform are preferably identical, provided with a plurality of pressure flow-restrictors such as SASO nozzles, and typically, with much less number of evacuation holes, to create a well functioning FRS mechanism and accordingly achieve high performance with respect to FM-stiffness and accuracy, large supporting forces (induced by about half of the driven pressure where the other half is sustained inside the flow restrictors), and to establish a locally balanced support without global effects. The two opposing active-surfaces of the PP-type platform are assembled substantially in parallel, having identical active-surfaces and aligned in parallel with a mirror-image symmetry. The plane of symmetry is essentially the imaginary mid-plane of the thin (sectionally) and wide (laterally) space that is created between the two confronting active-surface. The two opposing fluid-cushions are established as the object is inserted between the two opposing active-surfaces. The gaps of the two opposing fluid-cushions share the difference between the object width and the distance between the opposing active-surfaces in a self adaptive manner. If the two active-surfaces are similar and operate at the same operational conditions, the $\epsilon_n$ at both fluid-cushions will be equal. The distance between the two opposing surface must be adjusted to be equal to the anticipated supported object's width plus twice the desired gap $\epsilon_n$. Accordingly, When It is intended to grip objects of different width, the PP-type non-contact platform must includes a "panel width adjustment" mechanism, allowing adjustment of the distance between the two opposing active-surfaces. When trying to offset the position of the substrate towards one of the active surface, at the same time the forces at the closer active-surface are significantly increased and the forces at the other side of the substrate are significantly increased. This it the meaning of vacuum preload fluid-cushion that exhibits high flattening performance.

Similarly, it is a possibility to put to PV-type active surfaces to create a PV-PV type fluid-cushion. There is a significant difference between the PP-type fluid-cushion and PV-PV type fluid-cushion: the PP-type dual-side platform is subjected to the opposing forces that are developed between the fluid-cushions separated by the (floating) substrate being at equilibrium position, and the PV-PV type dual-side platform is not loaded by the fluid-cushions (at equilibrium position).

Another practical version of fluid-cushion is the PM-type of fluid-cushion where an active surface having basic cell similar to PP-type fluid-cushion (less evacuation channels) induced pressure forces on a flat substrate that is supported from its other side with contact, for example by vacuum or electrostatic chuck. In that case the PM-type act like a non-contact pressing surface, forcing the substrate to be flattened against the counter surface of the chuck.

There are many practical implementations of the above mentioned types of fluid cushions with respect to non-contact platforms for thermal-treatment processes of the present invention. Without derogating the generality, a basic distinction based on the non-contact platform's functionality will be made as follow:

A Non-contact platform or a sector of it that used only for supporting the object (in that case air or any other compatible inertial gas or liquid will be used), during the thermal-treatment process, in cooperation with a second platform that have thermal-treatment means.

A Non-contact platform or a sector of it that used for introducing the fluid used for the thermal-treatment process by the fluid cushion, and at the same time this fluid-cushion is also functioning to support the object to be treated.

A platform with respect to the present invention may be utilized for thermal-treatment process without any aeromechanical means, in cooperation with a second platform that have aeromechanical means.

It is mostly impotent to emphasize the beneficial of applying the above mentioned types of fluid-cushions that are equipped with flow restrictors in the non-contact platforms with respect to thermal-treatment apparatus of the present invention. By using flow restrictors that have fluidic return spring behavior such as SASO conduit, A very compact and uniform thermal-treatment environment can be safely established.

The term safety means that by using flow restrictor there is practically no risk of contact between the supporting surface of the platforms and the facing surface of the object, as large forces are rapidly developed when trying to close the gap in between them thus preventing any contact. For example, when a PV-fluid cushion supporting a 300 mm wafer, fluid-mechanic return forces of 10 kg can be develop by the that air-cushion if the wafer is forces to moved only few micrometer from equilibrium floating gap in a self adaptive manner (towards or away from the platform). This strong forces guarantee no-contact thus providing the option to create no-risk compact thermal-treatment environment.

The term compact is related to the small distance or gap (for example less than 0.5 mm, less than 0.1 mm, or even less than 0.02 mm gap), between the supporting surface of the platforms and the facing surface of the object. Accordingly, the temperature difference (between the thermal-platform facing surface to the object), imposed by the fluid cushion is significantly lowered.

The term uniform is related to the local balance behavior of all the above mentioned types of fluid-cushions, where the fluid is locally provided and evacuated within each of the relatively small (with respect to the object dimensions) repeatable basic cells, thus it has a local aero-mechanical mechanism for averaging the temperature.

Although some embodiments of the invention may be described with reference to heating a wafer, it will be appreciated by those skilled in the art that these embodiments may be modified, e.g., as described below, to implement a cooling of a wafer.

Reference is made to FIG. 1, which schematically illustrates a cross-section of a non-contact thermal system 100 including a thermal platform configuration 102, according to an exemplary embodiment of the invention.

According to an exemplary embodiment of the invention, configuration 102 may be implemented for heating of an object, e.g., a SC wafer 104, while the object is supported without contact, as described in detail below.

According to some exemplary embodiments of the invention, configuration 102 may include a top plate 110, as described in detail below. Top plate 110 may be separated, e.g., by a thermal-insulation layer 112, from an Aero-Mechanical (AM) section 108. Section 108 may include a support surface adapted to support wafer 104 without contact, e.g., by induced forces produced by a fluid cushion 106. Embodiments of such non-contact support surfaces are disclosed in International Patent Application PCT/IL02/01045, filed Dec. 27, 2002, entitled "HIGH-PERFORMANCE NON-CONTACT SUPPORT PLATFORMS" and published Jul. 24, 2003, as PCT Publication WO 030/60961 (Reference 1), the full disclosure of which is incorporated herein by reference.

Embodiments of the device, system and/or method of the present invention may implement such non-contact support surfaces as disclosed in Reference 1. Other embodiments of the devices, systems and/or methods of the present invention may implement any other suitable non-contact support surfaces.

According to exemplary embodiments of the invention, section 108 may include a PV-type or PA-type non-contact support surface, e.g., an aeromechanical configuration to maintain a PV-type or a PA-type fluid cushion, as described in Reference 1. Section 108 may include a plurality of pressure outlets 114 and a plurality of fluid-evacuation channels 117. Each of pressure outlets 114 may be fluidically connected through a respective pressure flow restrictor 119 to a high-pressure reservoir 121. Each of pressure outlets 114 may also be fluidically connected through a respective channel 118 in top plate 110 to a pressure outlet 120 in a surface 116 of platform 102. Pressure outlets 120 may provide pressurized fluid for generating pressure-induced forces, maintaining fluid cushion 106 in a gap, E, between wafer 104, and surface 116. Pressure flow restrictor 119 may characteristically exhibit a fluidic return spring behavior. For example, flow restrictor 119 may include a Self Adapted Segmented Orifice (SASO) nozzle, e.g., as described in International Application PCT/IL00/00500, filed Aug. 20, 2000, entitled "APPARATUS FOR INDUCING FORCES BY FLUID INJECTION" and published Mar. 22, 2001 as PCT Publication WO01/19572 (Reference 2), the full disclosure of which is incorporated herein by reference. At least some of fluid-evacuation channels 117 may be fluidically connected through a channel 124 to an inlet 126 in surface 116. According to some exemplary embodiments, e.g., wherein section 108 includes a PA-type support surface, an outlet 122 of channel 117 may be maintained at an ambient pressure. According to other exemplary embodiments, e.g., wherein platform 108 includes a PV-type support surface, outlet 122 may be maintained under a vacuum condition, for example, using a vacuum pump 128, which provides a desired vacuum intensity value, V, i.e., fluid cushion 106 may be a vacuum-preloaded fluid cushion capable of "clamping" wafer 104.

According to some exemplary embodiments of the invention, wafer 104 may be heated or cooled by a convective heat-transfer mechanism, e.g., by the pressurized fluid exiting outlet 120, as described below.

According to some embodiments of the invention, wafer 104 may be heated or cooled by a radiative heat-transfer mechanism, e.g., by heat radiated from surface 116.

According to some embodiments of the invention, wafer 104 may be heated or cooled by a conductive heat transfer mechanism, e.g., heat may be transferred between platform 102 to a surface 130 of wafer 104 opposite to surface 116 via fluid cushion 106.

It will be appreciated by those skilled in the art that methods, devices and/or systems according to embodiments of the invention, may implement one or more of these heat-transfer mechanisms, e.g., as described below.

According to exemplary embodiments of the invention, platform 102 may include one or more heat exchanging elements 140. Heat exchanging elements 140 may include any heating or cooling element known in the art, for example, a resistor that may emit heat when supplied with an electric current. Thus, according to these embodiments, a temperature, $T_{TP}$, of top plate 110 may be increased using elements 140. Thus, heating elements 140 may be activated to heat wafer 104 by a radiative and/or a conductive heat-transfer mechanism, as described above.

Additionally or alternatively to heating elements 140, according to some embodiments of the invention, system 100 may include a heat exchanging sub-system 132 to increase or decrease the temperature, $T_{in}$, of the fluid entering AM section 168. For example, heat exchanging sub-system 132 may be located in pressure reservoir 121. Heat exchanging sub-system 132 may include any heat exchanging sub-system known in the art, for example, sub-system 132 may include a resistor that may emit heat when supplied with an electric current.

A heat flux may be generated between top plate 110 and the fluid flowing through channel 118, e.g., if the temperature of the fluid flowing through channel 118 is different than the temperature of top plate 110.

It will be appreciated by those skilled in the art that the difference, $T_{out}-T_1$, between the temperature, $T_{out}$, of the fluid exiting outlet 120 and the temperature, $T_1$, of the fluid exiting outlet 114 depends on the direction and magnitude of the heat flux between top plate 110 and the pressurized fluid flowing through channels 118. For example, $T_{out}$ may be lower than $T_1$, if $T_{TP}<T_1$, and $T_{out}$ may be higher than $T_1$ if $T_{TP}>T_1$. The magnitude of the difference $|T_{out}-T_1|$ may depend on the magnitude of the heat flux between the fluid flowing through channels 118 and top plate 110, e.g., for the case of $T_{TP}<T_1$, the smaller the heat flux the smaller the difference $T_{out}-T_1$. Thus, for the case of $T_{TP}<T_1$, the smaller the heat flux, the more heat may be convected to wafer 104 by the pressurized fluid fed to cushion 106. Accordingly, for the case of $T_{TP}>T_1$, the higher the heat flux between top plate 110 and the pressurized fluid flowing thorough channels 118, the higher $T_{out}$, and the more heat may be convected to wafer 104 by the pressurized fluid fed to cushion 106. Thus, the amount of heat convected to wafer 104 by the fluid-exiting outlet 120 may depend on the heat flux between top plate 110 and the pressurized fluid flowing through channels 118.

The magnitude of the heat-flux between the fluid flowing through channels 118 and top plate 110 may depend, for example, on the geometry of channels 118, on the Mass-Flow-Rate (MFR) of the fluid flowing through the channels, and/or on the magnitude of the difference between the temperature of top plate 110 and the temperature of the fluid flowing through channels 118.

According to some exemplary embodiments of the invention, the magnitude of the heat-flux between the fluid flowing through channels 118 and top plate 110 may be increased by increasing the contact area between the fluid and the inner-surface of channels 118. For example, at least some of channels 118 may be relatively wide and/or long, such that the channels may have relatively large inner-surface area.

Thus, according to embodiments of the invention, wafer 104 may be heated by heating top plate 110 and/or by feeding fluid cushion 106 with hot fluid, i.e., fluid exiting outlets 120. The temperature $T_{out}$ may be increased by activating heater 132 and/or heaters 140, as described above.

According to exemplary embodiments of the invention, sections 108 and 110 may be formed of materials thermally characterized according to a desired range of $T_{in}$ to be implemented by the system. For example, section 108 may be formed of a suitable metal, e.g., Aluminum if relatively low $T_{in}$ values, e.g., 400° C. or lower, are to be implemented. Section 108 may be formed, for example, of Stainless Steel or Nickel, if medium $T_{in}$ values, e.g., 600° C. or lower, are to be implemented. Section 108 may be formed of a suitable ceramic material, e.g., Aluminum Oxide, Silicon Nitride or Aluminum Nitride, if relatively high $T_{in}$ values, e.g., 600° C. or higher, are to be implemented.

According to embodiments of the invention, system 100 may be implemented to control $T_w$, as described below.

According to exemplary embodiments of the invention, system 100 may also include one or more temperature-sensing devices for sensing the temperature of at least some parts of wafer 104. According to some exemplary embodiments of the invention system 100 may include one or more non-contact temperature sensors. For example, system 100 may include at least one Infra Red (IR) sensing device 150, as is known in the art. It will be appreciated by those skilled in the art, that according to embodiments of the invention, any other suitable temperature sensing device may be implemented additionally or alternatively, for example, one or more thermocouples 157 may be embedded in a wafer-like substrate, as is known in the art.

System 100 may also include a controller 160, which may receive, for example, from sensor 150, a signal 155 corresponding to the value of $T_w$. Controller 160 may control the value of $T_w$, e.g., as described below.

According to some exemplary embodiments of the invention, $T_w$ may be controlled by controlling the gap $\epsilon$, since the amount of heat transferred to wafer 104 may be related to the gap $\epsilon$. For example, the wider the gap $\epsilon$, the higher the MFR of the fluid fed to fluid cushion 106, as described in Reference 1. Thus, the wider the gap $\epsilon$, the more heat may be convected to wafer 104 by the pressurized fluid exiting outlet 120.

The size of gap $\epsilon$ may be controlled by controlling the pressure, P, of the pressure supply and/or by controlling the vacuum intensity V, e.g., as described in Reference 1. For example, E may be increased by increasing P or by decreasing V.

According to some exemplary embodiments of the invention, the size of the gap $\epsilon$ may be in the range of 5 μm to 500 μm or higher, P may have a value between 10 mbar and 500 mbar, and V may have a value between 10 mbar and 300 mbar. However, it will be appreciated that according to other embodiments of the invention, any other suitable values $\epsilon$, P and/or V may be implemented.

Thus, according to exemplary embodiments of the invention, $T_w$ may be controlled, e.g., using sensor 150 and/or controller 160, by controlling, the value of $T_1$, $T_{TP}$, and/or $T_{out}$, e.g., by controlling the activation of heating elements 140 and/or heating sub-system 132, and/or by controllably regulating the MFR of the fluid fed to fluid cushion 106 and/or the fluid cushion gap $\epsilon$, e.g., by controlling the values of P and/or V, as described above.

According to some exemplary embodiments of the invention, the temperature of one or more sections of wafer 104 may be selectively controlled by selectively controlling P and/or V in one or more corresponding sections of configuration 102, and/or by selectively controlling, e.g., using controller 160, activation of one or more heating elements, e.g., elements 140, in one or more corresponding sections of configuration 102.

According to some exemplary embodiments of the invention, system 100 may be implemented to increase, decrease, and/or control the temperature, $T_w$, of wafer 104 according to a first, e.g., relatively fast, time-scale, while the value of $T_{TP}$ may change according to a substantially different second, e.g., relatively slow, time-scale, as explained below.

The pressurized fluid exiting outlets 120 may be implemented to controllably increase/decrease $T_w$, e.g., as described above. Thus, the temperature $T_w$ of wafer 104 may be controlled substantially separately from the temperature $T_{TP}$ of top plate 110, for example, by controlling $T_{out}$, and/or by controlling the MFR of the fluid fed to fluid cushion 106, i.e., the fluid exiting outlets 120, e.g., as described above.

Thus, according to embodiments of the invention, the thermal mass of wafer 104 may be substantially separated from the thermal mass of platform 102, for example, by controlling the amount of heat convected to wafer 104 by the fluid fed to fluid cushion 106, as described above.

Thus, according to embodiments of the invention, the temperature, $T_w$, of wafer 104 may be controlled according to a first, e.g., relatively fast, time-scale, while the value of $T_{TP}$ may change according to a substantially different second, e.g., relatively slow, time-scale.

According to exemplary embodiments of the invention, the degree of separation between the first and second time scales may be increased or decreased, e.g., by respectively increasing or decreasing, e.g., as described above, the ratio between the amount of heat conveyed to wafer 104 by the fluid fed to fluid cushion 106 and the amount of heat transferred to wafer 104 by radiation from surface 116 and by conduction through fluid cushion 106.

According to some embodiments of the invention, heat of the fluid exiting platform 102, i.e., via outlet 122 may be implemented for heating the fluid entering platform 102, e.g., to increase $T_{in}$. This may be achieved, for example, using a heat exchanger (not shown), as is known in the art.

According to some embodiments of the invention, configuration 102 may further include at least one flow restrictor 119a having flow-restriction characteristics different from the flow-characteristics of restrictors 119. For example, flow restrictor 119a may be characterized by relatively low flow-restriction capabilities. According to some of these embodiments, restrictor 119a may exhibit substantially no flow restriction.

According to some exemplary embodiments of the invention, restrictor 119a may be implemented for feeding cushion 106 with hot fluid in a relatively high MFR. Consequently, the temperature $T_w$ of wafer 104 may be increased in a substantially short period of time.

According to some embodiments of the invention, one or more of channels 117 may be fluidically disconnected from pump 128 and fluidically connected to reservoir 121, for example, using one or more flow control valves (not shown). Thus, pressurized fluid, for example, relatively low-pressurized fluid in a relatively high MFR, may be supplied to fluid cushion 106 via channels 117 in order to achieve an increase of $T_w$ in a substantially short period of time.

Figure 2:
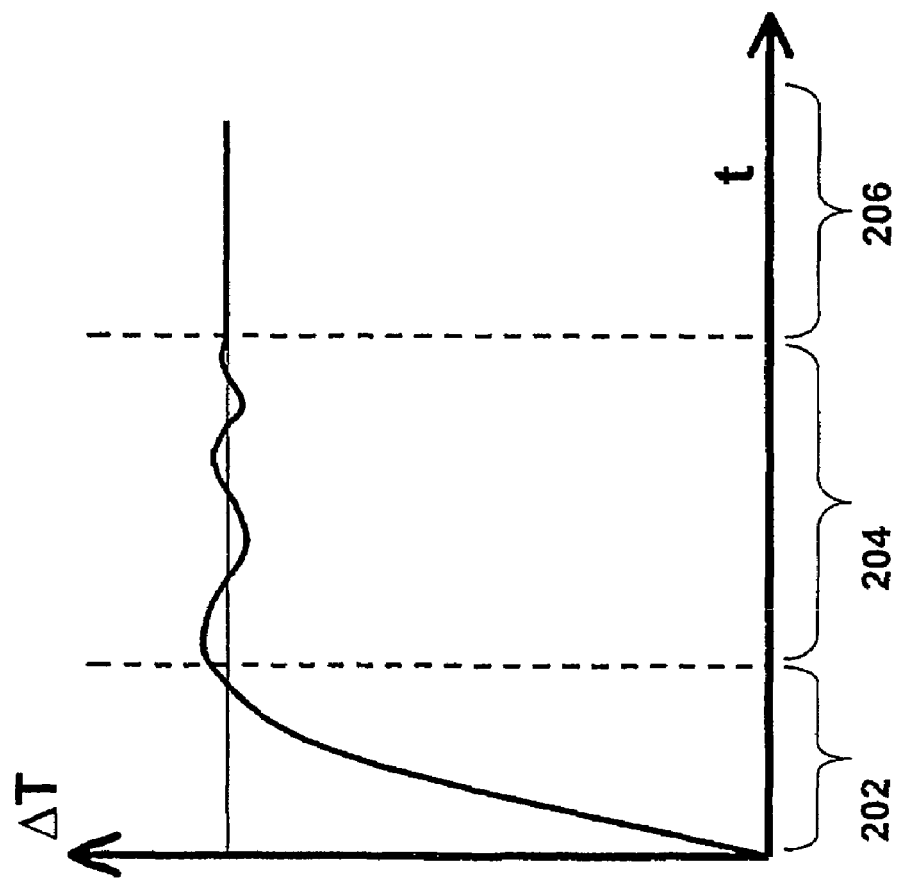
FIG. 2 is a schematic illustration of a graph depicting a change in the temperature of a wafer versus time, in accordance with exemplary embodiments of the invention.

Reference is also made to FIG. 2, which schematically illustrates a graph depicting a change, $\Delta T_w$, in the temperature of wafer 104, versus time, in accordance with exemplary embodiments of the invention.

A heating procedure of wafer 104 may include three phases, namely a "raise-up" phase 202, a "transitional" phase 204, and a "steady-state" phase 206 in which a steady state temperature is maintained. Phase 202 may include a substantially monotonous increase of the temperature until a value substantially close to the steady state temperature is obtained. Phase 204 may include "fine-tuning" of the temperature values to achieve the steady state temperature.

It will be appreciated by those skilled in the art that according to embodiments of the invention, the duration of phase 202 and/or phase 204 may be shortened significantly, for example, by obtaining a sufficient separation, i.e., decoupling, between the first time-scale and the second time scale, as described above.

According to exemplary embodiments of the invention, a relatively high MFR may be implemented, e.g., by controller 160 as described above, during phase 202 for obtaining a relatively large increase, of $T_w$, in a relatively short time period. A "fine-tuning" of the value of $T_w$, e.g., during phase 204 and/or during phase 206, may be implemented by controlling, e.g., as described above, the temperature $T_{in}$, by controlling the values of P and/or V, and/or by controlling the activation of heating elements 140.

According to some exemplary embodiments of the invention, the "fine tuning" of the temperature may also include a "local fine tuning" of one or more sections of wafer 104, for example, by selectively controlling the values of P and/or V of corresponding sectors of configuration 102, e.g., as described below, and/or by selectively controlling activation of one or more of heating elements 140, e.g., as described herein. Thus, for example, a relatively uniform, i.e., homogeneous, temperature may be achieved across wafer 104.

It will be appreciated by those skilled in the art that according to exemplary embodiments of the Invention, platform 102 may be controlled, e.g., as described above, to control the temperature of a wafer, e.g., wafer 104, according to any desired temperature versus time profile. For example, the temperature profile may include a temperature profile substantially continuous in time, e.g., including periodic temperature increases and temperature decreases with reference to a nominal temperature.

According to some embodiments of the invention, platform 102 may further be implemented for selectively controlling the temperature of one or more sections of wafer 104, as described below.

According to some exemplary embodiments of the invention, a desired temperature profile across the surface of wafer 104 may be achieved by arranging the flow restrictors, e.g., restrictors 119 and/or restrictors 119a, according to a predetermined pattern, as described below.

Figure 3:
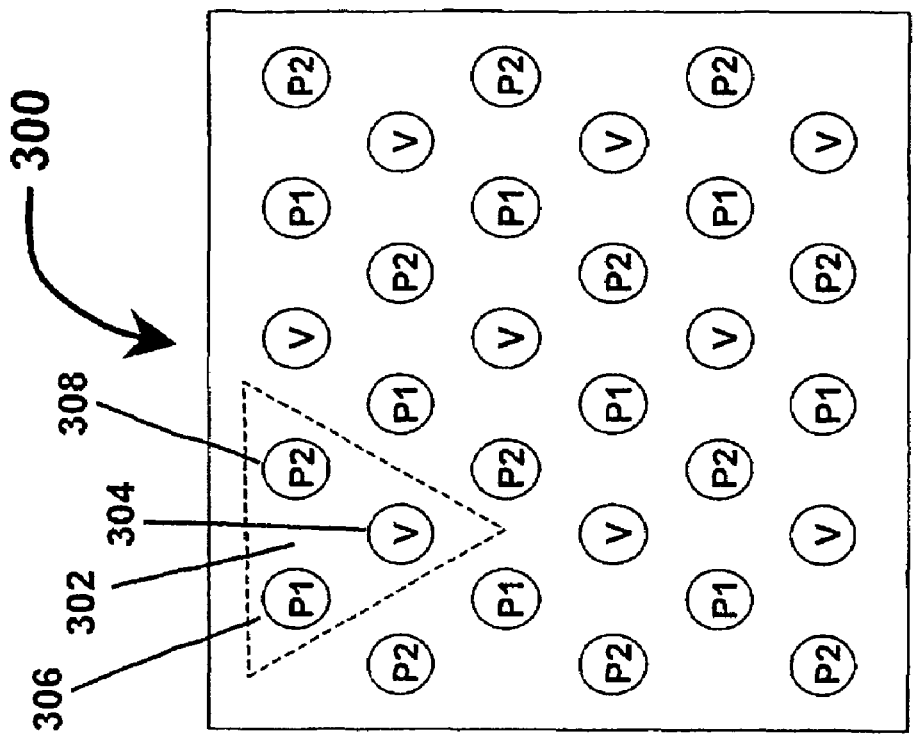
FIG. 3 is a schematic, top-view illustration of a vacuum preloaded (PV-type) non-contact support arrangement, in accordance with some exemplary embodiments of the invention.

Reference is also made to FIG. 3, which schematically illustrates top-view of a PV-type arrangement 300, in accordance with some exemplary embodiments of the invention.

According to some exemplary embodiments of the invention, arrangement 300 may be implemented by thermal platform configuration 102, i.e., the evacuation channels and the flow restrictors of configuration 102 may be arranged according to arrangement 300.

Arrangement 300 may include a cell 302, i.e., a pattern of flow restrictors and evacuation holes.

According to some exemplary embodiments of the invention, cell 302 may include at least one evacuation hole 304, at least one first-type flow restrictor 306 acting as a fluidic spring, and at least one second-type flow restrictor 308. Evacuation hole 304 may be fluidically associated with an evacuation channel, e.g., channel 117 (FIG. 1), which may be connected to a vacuum reservoir, e.g., reservoir 128 (FIG. 1). It will be noted, that according to some alternative embodiments, cell 302 may include flow restrictors of one-type and evacuation holes of more than one type.

According to exemplary embodiments of the invention restrictor 306 and restrictor 308 may have different flow-restriction characteristics. For example, restrictor 308 may have a lower flow-restriction capability compared to restrictor 306. Accordingly, restrictor 308 may provide fluid cushion 106 with hot fluid of a MFR higher than the MFR of the hot fluid provided by restrictor 306. Consequently, the temperature of a section of wafer 104 positioned substantially over restrictor 308 may be higher than the temperature of a section of wafer 104 positioned substantially over restrictor 306.

Thus, according to embodiments of the invention, the flow restrictors and evacuation channels of platform 102 may be arranged according to a pre-determined pattern in order to selectively control the temperature of one or more sections of wafer 104, for example, according to a desired temperature profile, e.g., to achieve a substantially uniform temperature across wafer 104.

It will be appreciated by those skilled in the art, that embodiments of the invention may include thermal platforms, e.g., as described below, implementing configurations other than configuration 102, for example, to achieve a desired degree of separation between the thermal mass of the thermal platform and the thermal mass of the wafer, to achieve a desired temperature profile, e.g., a uniform temperature, across a wafer, to achieve a desired temperature versus time profile, and/or to implement a different combination of heat transfer mechanisms, as described above.

Figure 4:
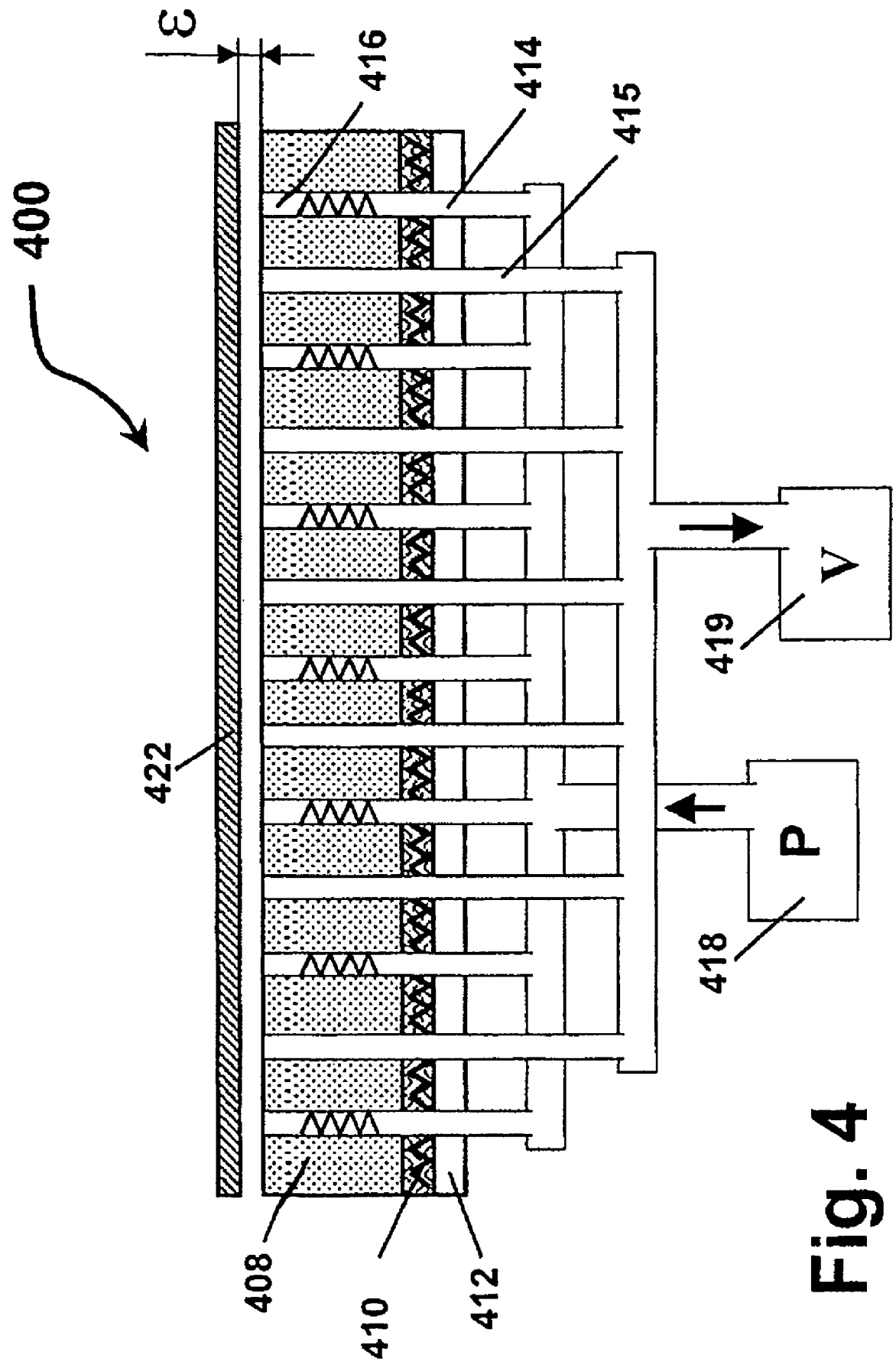
FIG. 4 is a schematic, cross-section illustration of a thermal platform configuration according to another exemplary embodiment of the invention.

Reference is made to FIG. 4, which schematically illustrates a cross-section of a thermal platform configuration 400 according to another exemplary embodiment of the invention.

According to another exemplary embodiment of the invention, configuration 400 may be implemented by system 100 (FIG. 1), e.g., to replace configuration 102 (FIG. 1), and may include a PA-type or a PV-type AM section 408, e.g., analogous to section 108 described above with reference to FIG. 1. Configuration 400 may also include a heat exchanging section 410 including a plurality of channels 414 to fluidically associate a plurality of pressurized fluid channels 416 of section 408 with a pressure reservoir 418. Configuration 400 may also include a thermal-insulation layer 412 to thermally insulate section 410.

Section 410 may include any suitable heat exchanging elements, e.g., as described above with reference to elements 140 (FIG. 1).

It will be appreciated by those skilled in the art that configuration 400 may be implemented, e.g., in analogy to the implementations of configuration 102 described above with reference to FIG. 1, for heating a wafer 422 and/or controlling the temperature of wafer 422.

It will be appreciated by those skilled in the art that according to some embodiments of the invention, section 408 and section 410 may be implemented by one combined section including AM elements, and one or more heating elements.

Figure 5:
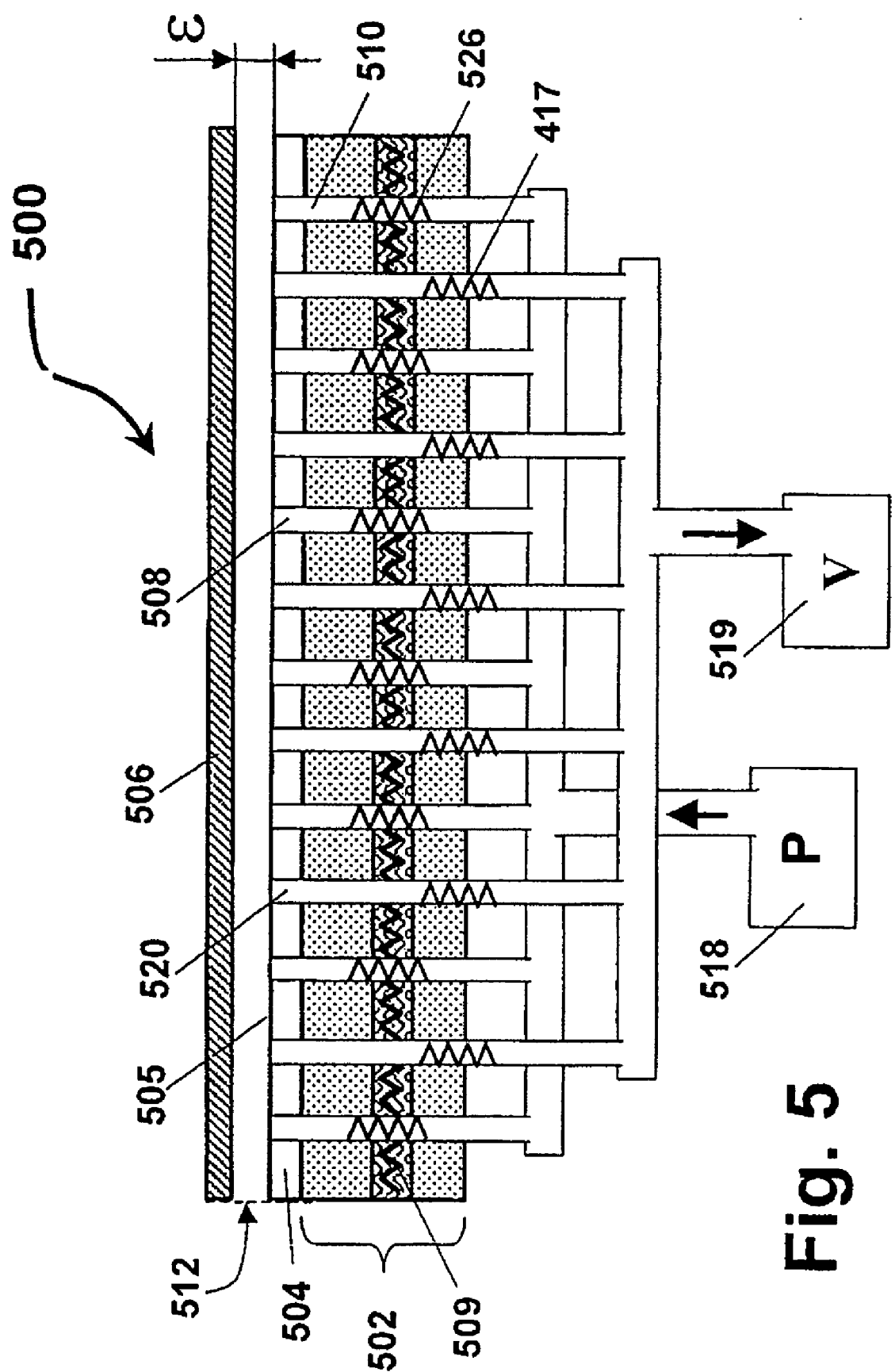
FIG. 5 is a schematic cross-section illustration of a thermal platform configuration according to yet another exemplary embodiment of the invention.

Reference is also made to FIG. 5, which schematically illustrates a cross-section of a thermal platform configuration 500 according to yet another exemplary embodiment of the invention.

According to exemplary embodiments of the invention, configuration 500 may be implemented by system 100 (FIG. 1), e.g., to replace configuration 102 (FIG. 1), and may include an AM section 502. Section 502 may include a non-contact support surface and a heating configuration, e.g., including a plurality of heat exchanging elements 509, to change the temperature of pressurized fluid flowing through channels 510, e.g., as described above.

Configuration 500 may also include a thermal-insulation layer 504 to thermally insulate section 502 from a wafer 506. Layer 504 may include a plurality of channels 508 to convey the pressurized fluid exiting channels 510 to a fluid cushion 512 formed between facing surfaces of layer 504 and wafer 506. Layer 504 may also include a plurality of evacuation channels 520. A top surface 505 of layer 504, i.e., the surface facing wafer 506, may be formed of or coated with a low heat-emissive material, e.g., a high reflectivity metal coating or a matrix of oxide thin film layers. Thus, the temperature of wafer 506 may be changed by changing the temperature of the fluid flowing through channels 510.

It will be appreciated by those skilled in the art that configuration 500 may provide a relatively high degree of separation between the thermal mass of section 502 and the thermal mass of wafer 606, since wafer 506 is thermally separated from section 502 by insulation layer 504. Thus, a relatively fast change of $T_w$ may be achieved by implementing configuration 500, i.e., by substantially separating the temperature time scales of section 502 and wafer 506, as described above. This may be achieved, for example, by implementing a relatively high MFR of the fluid fed to fluid cushion 512, e.g., as described above.

It will be appreciated by those skilled in the art that configuration 500 may be implemented, e.g., in analogy to the implementations of configuration 102 described above with reference to FIG. 1, for heating wafer 506 and/or controlling the temperature of wafer 506.

Although some methods and/or devices of embodiments of the invention may refer to increasing the temperature, $T_w$, of the wafer, it will be appreciated by those skilled in the art that according to other embodiments, these methods and/or devices may be modified to decrease the temperature of the wafer, i.e., to cool the wafer. For example, heating sub-system 132 (FIG. 1) described above may be replaced by a cooling sub-system, e.g., as is known in the art, to decrease the temperature of the fluid entering the thermal platform.

It will be appreciated by those skilled in the art that a non-contact thermal system, according to some embodiments of the invention, may be implemented to increase/decrease and/or control the temperature of a wafer, for example, by heating/cooling substantially a first surface of the wafer, e.g., the surface of the wafer ("back-surface") facing the thermal platform configuration, as described above. Thus, according to some embodiments of the invention, at least one other surface of the wafer, e.g., a surface ("top-surface") opposite to the first surface, may be exposed to the environment, and may undergo any desired process, e.g., a CVD, PVD or Etching process as are known in the art, while the wafer is being heated/cooled. For example, a gas or a fluid may be applied to the top-surface as part of a chemical process, while applying heat to the backside of the wafer.

Although the above discussion refers to implementing a PA-type or a PV-type non-contact supporting fluid cushion, it will be appreciated by those skilled in the art that system 100 (FIG. 1) may be modified to implement any other suitable non-contact supporting platform, e.g., a dual-sided PP-type or a PVPV-type platform, as described in Reference 1. For example, system 100 (FIG. 1) may be modified to implement a PP-type or a PVPV-type dual-sided support configuration, as described below.

Figure 6:
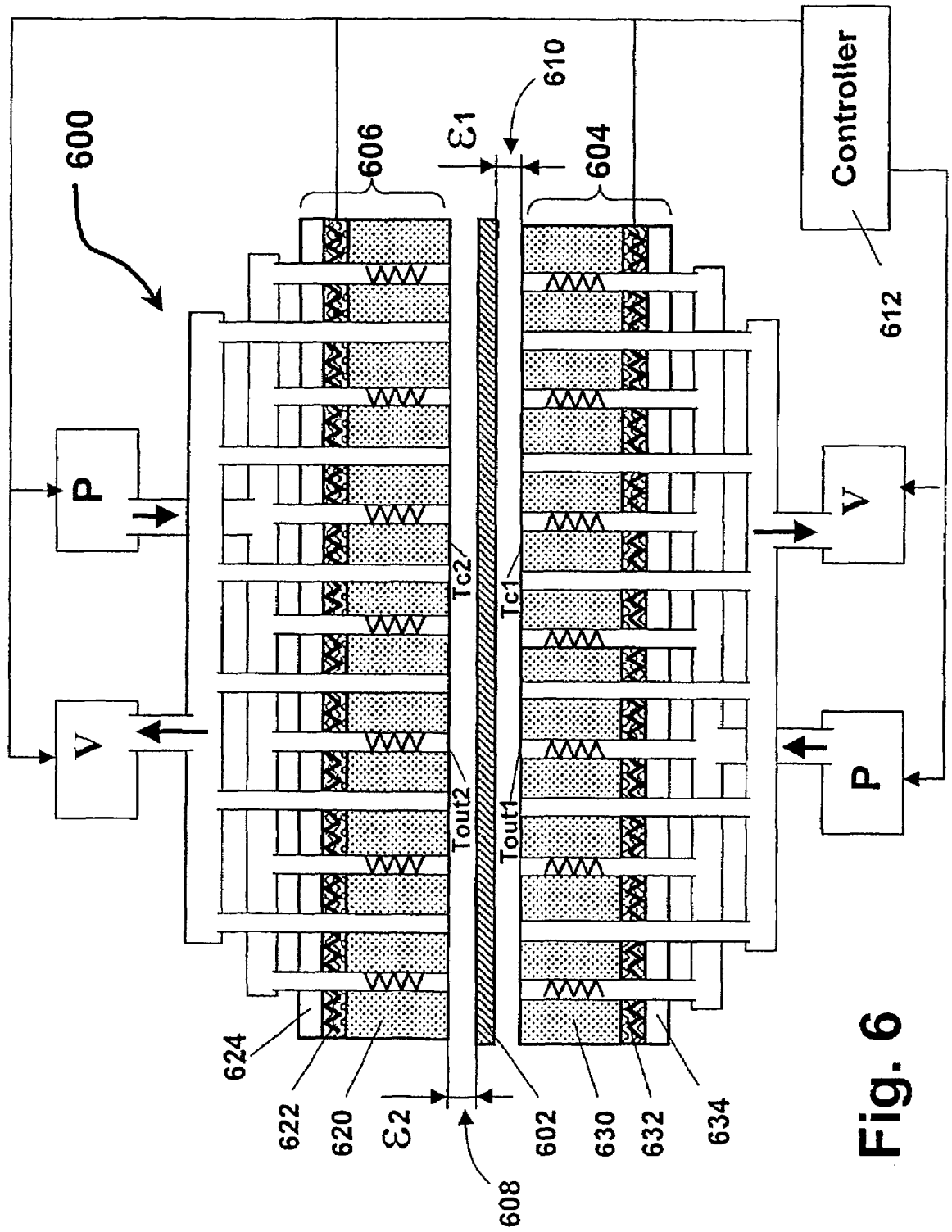
FIG. 6 is a schematic, illustration of a non-contact thermal system, in accordance with another exemplary embodiment of the invention.

Reference is made to FIG. 6, which schematically illustrates a dual-sided non-contact thermal system 600, in accordance with other embodiments of the invention.

According to embodiments of the invention, system 600 may implement a PP-type or a PVPV-type non-contact support configuration, as described below.

According to exemplary embodiments, system 600 may include a first thermal platform configuration 604 and a second thermal platform configuration 606, associated with opposite surfaces of a wafer 602, respectively.

Configuration 604 and configuration 606 may each include any suitable non-contact thermal platform configuration, e.g., as described above. For example, configuration 604 may include a configuration similar to configuration 102 (FIG. 1) and configuration 606 may include a configuration similar to configuration 400 (FIG. 4). Configurations 604 and 606 may each include, for example, a PA-type support surface, e.g. as described above. Thus, system 600 may implement, for example, a PP-type non-contact support configuration. According to other embodiments configurations 604 and 606 may each include, for example, a PV-type support surface, e.g. as described above. Accordingly, system 600 may implement a PVPV-type non-contact support configuration.

According to some embodiments of the invention, configuration 604 or configuration 606 may be also implemented for loading/unloading of wafer 602 to system 600. For example, configuration 604 may be adapted to load wafer 602 by "grabbing" wafer 602 without contact and positioning it under configuration 606.

According to exemplary embodiments of the invention, system 600 may include a control unit 612 to control the temperature of wafer 602, as described below.

According to exemplary embodiment, a relatively low temperature, $T_{c1}$, of platform 604, and a relatively high temperature, $T_{c2} > T_{c1}$, of platform 606 may be controllably maintained by unit 612, for example, by controllably activating heating and/or cooling elements of platform 604 and/or of platform 606, e.g., as described above.

Figure 7A:
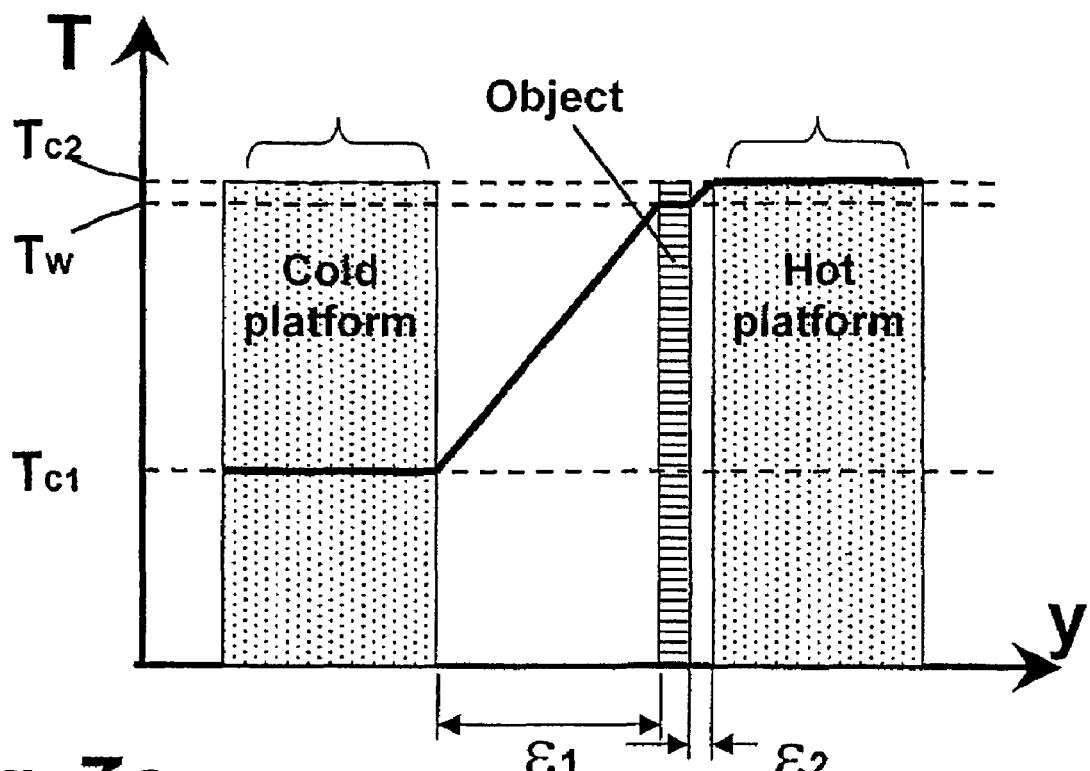
FIGS. 7a and 7b are schematic illustrations of temperature versus vertical location in the system of FIG. 6.
Figure 7B:
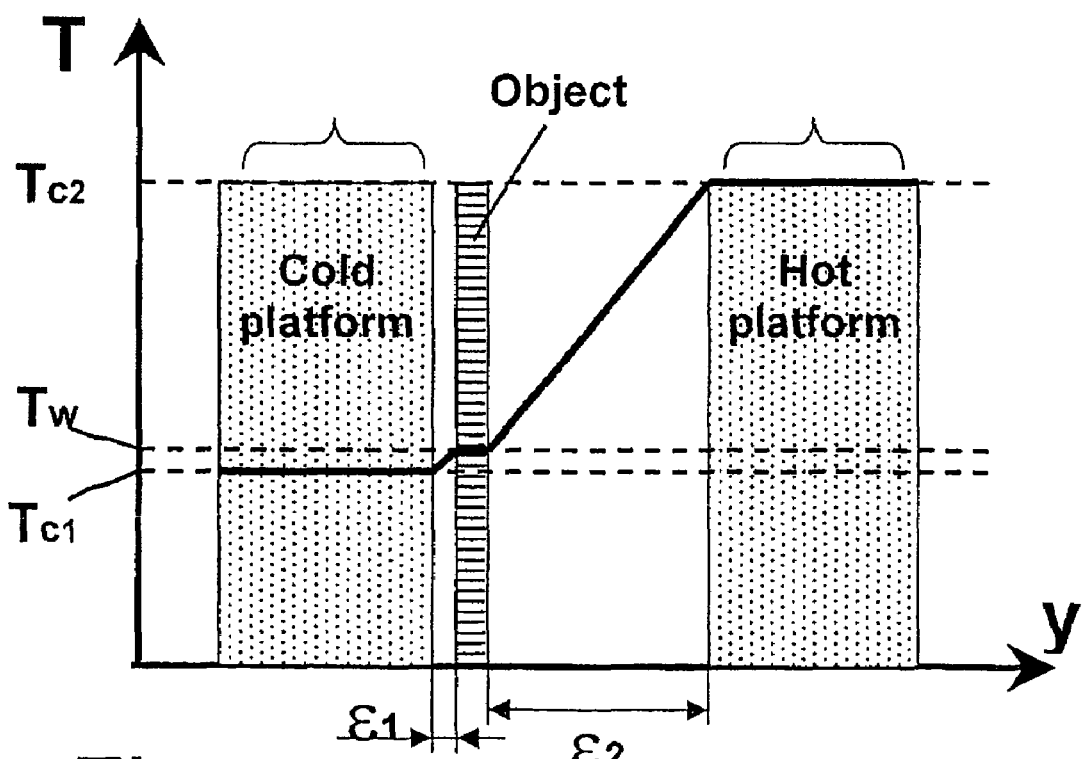

Reference is also made to FIGS. 7a and 7b, which schematically illustrate temperature versus a vertical location, y, corresponding to two locations of wafer 602 with respect to platforms 604 and 606, respectively, according to an exemplary embodiment of the invention.

As illustrated in FIGS. 7a and 7b, the temperature, $T_w$, of wafer 602 may depend on the amount of the heat transferred to the wafer from each one of platforms 604 and 606.

As described above, the amount of heat transferred to wafer 602 from platform 604 may depend, for example, on a gap, $\epsilon_1$, between wafer 602 and platform 604, and/or on the mass flow rate, MFR1, and/or the temperature, $T_{out1}$, of the pressurized fluid fed to a fluid cushion 610 formed between wafer 602 and platform 604. Accordingly, for example, the amount of heat transferred to wafer 602 from platform 606 may depend on a gap, $\epsilon_2$, between wafer 602 and platform 606, and/or on the mass flow rate, MFR2, and/or the temperature, $T_{out2}$, of the pressurized fluid fed to a fluid cushion 608 formed between wafer 602 and platform 606.

Thus, $T_w$ may be controlled according to the values of $T_{c2}-T_w$ and $T_w-T_{c1}$, which may be controlled by MFR2, $T_{out2}$ and/or $\epsilon_2$, and by MFR1, $T_{out1}$ and/or $\epsilon_1$, respectively.

Thus, according to exemplary embodiments of the invention, control unit 612 may control $T_w$ by controlling P1, V1, $T_{out1}$, P2, V2, $T_{out2}$, MFR1, and/or MFR2, as described above, wherein P1 and P2 are the respective pressures supplied to configurations 604 and 606, and V1 and V2 are the respective vacuum values, which may be applied to configurations 604 and 606.

It will be appreciated by those skilled in the art that according to these exemplary embodiments of the invention, unit 612 may be implemented to control the temperature of wafer 602 according to any desired temperature versus time profile.

It will also be appreciated by those skilled in the art, that system 600 may allow controllably increasing/decreasing $T_w$ in relatively short time periods, with relatively less sensitivity to the separation of the thermal mass of wafer 602 from the thermal mass of platforms 604 and 606. This may be related to the fact that each of the platforms may be maintained at a substantially constant temperature, while the control of $T_w$ is accomplished via control of P1, V1, $T_{out1}$, P2, V2, $T_{out2}$, MFR1, and/or MFR2.

According to some embodiments of the invention, system 600 may include any suitable mechanical means for presetting nominal values of gaps $\epsilon_1$ and $\epsilon_2$ and for controllably changing $\epsilon_1$ and $\epsilon_2$ according to a desired temperature of wafer 602. For example, platform 604 and/or platform 606 may be mounted on a slide (not shown) configured to enable vertical movement of platform 604 and/or platform 606. For example, the slide may be driven using one or more pneumatic, electric or mechanical actuators.

According to some exemplary embodiments, configuration 600 may be implemented to maintain a ratio, e.g., of between 10 and 100, between $\epsilon_1$ and $\epsilon_2$. For example, the value of $\epsilon_2$, e.g., $\epsilon_2=500$ µm, may be maintained to be 100 times larger than the value of $\epsilon_1$, e.g., $\epsilon_1=5$ µm, in order to decrease the temperature of wafer 602; and the value of $\epsilon_1$, e.g., $\epsilon_1=500$ µm, may be maintained to be 100 times larger than the value of $\epsilon_2$, e.g., $\epsilon_2=5$ µm, in order to increase the temperature of wafer 602. Thus, an increase or decrease of the temperature of wafer 602 may be performed dynamically by controlling the ratio between $\epsilon_1$ and $\epsilon_2$. It will be appreciated that according to other embodiments of the invention, any other suitable values $\epsilon$, P and/or V may be implemented.

According to some exemplary embodiments each of platforms 604 and 606 may include a PV-type support surface, e.g., as described above. One of platforms 604 and 606, e.g., platform 604, may be maintained at a relatively high temperature, while the other platform, e.g., platform 606, may be maintained, e.g., by control unit 612. Platform 604 and/or platform 606 may be vertically moved, e.g., as described above, to maintain a relatively small gap $\epsilon_1$ compared with gap $\epsilon_2$, i.e., $\epsilon_1 \ll \epsilon_2$, e.g., $\epsilon_1=20$ µm and $\epsilon_2=40$ mm. Thus, a relatively high rate change of the temperature of wafer 602 may be achieved by controllably increasing decreasing the size of gap $\epsilon_1$ and/or the size of gap $\epsilon_2$, e.g., such that the temperature of the wafer is affected substantially by only one of the platforms, e.g., the platform closer to the wafer.

According to some embodiments of the invention, a ratio between $\epsilon_1$ and $\epsilon_2$ corresponding to a desired temperature increase or decrease of wafer 602 may also be related, for example, to the thickness of wafer 602.

According to some exemplary embodiments of the invention, both platform 604 and platform 606 may be implemented for heating or for cooling. In such embodiments a resulting heat loss of wafer 602 or a heat gain of the surrounding environment may be minimal. Therefore a significantly high heating/cooling rate of wafer 602 may be achieved. In these embodiments, relatively small values, e.g., of between 5 µm and 200 µm, of gap $\epsilon_1$ and gap $\epsilon_2$ may be maintained, and temperature $T_w$ may be controlled by controllably activating heat exchanging elements 622 and/or 632. Relatively fast temperature changes may be achieved by controlling MFR1, MFR2, $T_{out1}$ and/or $T_{out2}$.

According to embodiments of the invention, a top surface, e.g., surface 106 (FIG. 1) of the thermal platforms described above may have an area larger than the area of the surface of the wafer facing the thermal platform. Thus, it may be required to regulate thermal edge effects that may occur, for example, in proximity to one or more edges, i.e., boundaries, of the fluid cushion formed between the surface of the thermal platform and the surface of the wafer.

Figure 8:
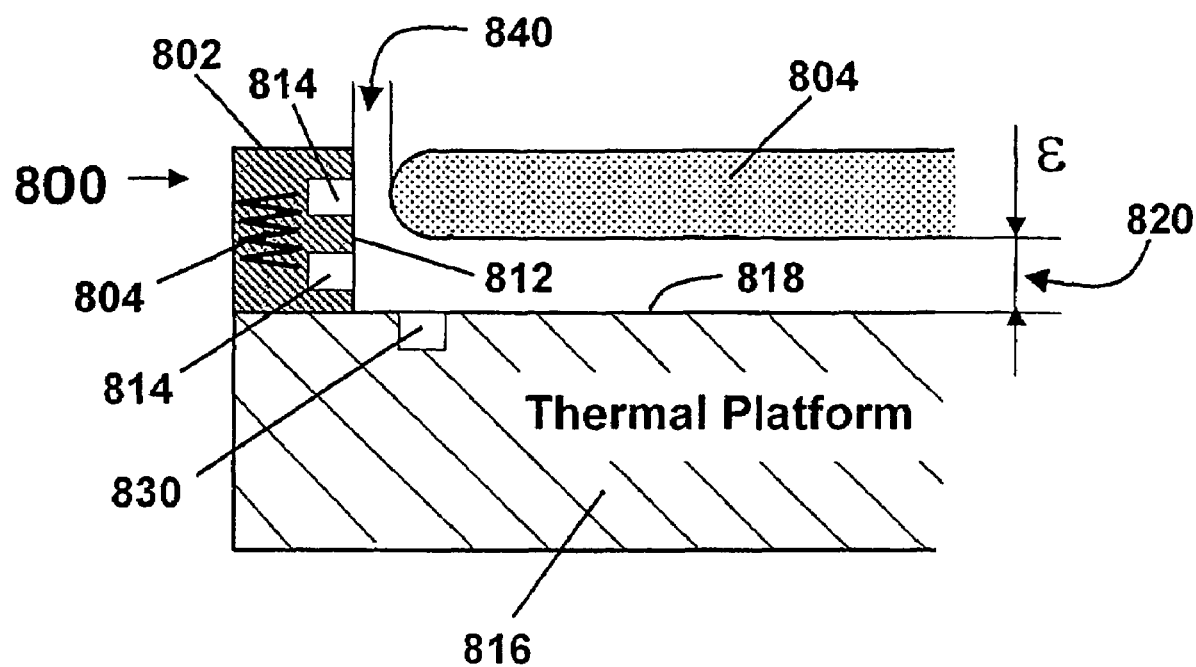
FIG. 8 is a schematic illustration of a fluid-cushion thermal insulation arrangement according to some exemplary embodiments of the invention.

Reference is made to FIG. 8, which schematically illustrates a fluid cushion thermal insulation arrangement 800 according to some exemplary embodiments of the invention.

According to some embodiments of the invention, arrangement 800 may be implemented in order to regulate, e.g., minimize, thermal edge effects, which may occur at one or more edges of a fluid cushion formed between a wafer 804 and a thermal platform 816.

According to some exemplary embodiments of the invention, arrangement 800 may include a passive-insulation arrangement. For example, arrangement 800 may include an insulation layer 802 positioned in proximity to the edge of wafer 804. The insulation layer may be formed of any suitable thermal-insulating material, e.g., Quartz or Fused Silica.

According to some exemplary embodiments of the invention, arrangement 800 may additionally or alternatively include an active insulation arrangement. For example, arrangement 800 may include a surface 812 perpendicular to a support surface 818 of platform 816. Surface 812 may be controllably heated or cooled according to a desired temperature of wafer 804. Additionally or alternatively, surface 812 may include a plurality of apertures 814 to discharge fluid of a desired temperature.

Additionally or alternatively, according to some embodiments of the invention, pressurized hot fluid may be injected from an aperture 830 in surface 818.

Additionally or alternatively, the edge effects may be regulated by selectively controlling, e.g., as described above, a gap E between wafer 804 and surface 818, e.g., at sections corresponding to one or more edges of wafer 804.

According to some embodiments of the invention, a gap 840 between an edge of wafer 804 and surface 812 may be fluidically controlled to dynamically provide a thermally closed fluid cushion environment, i.e., a fluid cushion 820 may be thermally separated from the environment. This may be achieved, for example, by implementing a plurality of apertures 830 in platform 816. A vacuum suction may be applied to apertures 830 in order to create a vacuum suction ring arrangement around wafer 804. The suction ring arrangement may also substantially reduce thermal interaction between fluid cushion 820 and the environment. Alternatively, for example, pressurized fluid may be injected through apertures 830 to reduce the amount of fluidic exchange, i.e., the flow of fluid, between fluid cushion 820 and the environment.

Reference is made to FIG. 9, which schematically illustrates a multi-chamber non-contact thermal system 900, in accordance with some exemplary embodiments of the invention.

According to exemplary embodiments of the invention, system 900 may be able to thermally process, e.g., heat or cool, a plurality of substrates 910, e.g., wafers and/or Flat Panel Display (FPD) panels. System 900 may include a plurality of non-contact thermal chambers 902. Chamber 902 may include a PA or a PV type non-contact support surface 904 to support substrate 910, e.g., as described above, and a heating or cooling unit 906. Since, substrate 910 is supported without contact during the thermal-process, the creation of hot or cold spots may be avoided. System 900 may additionally include any suitable lateral movement limiters and/or clamping configurations (not shown) to prevent lateral movement of the substrate 910 during the thermal process. The plurality of chambers 902 may be arranged one above the other inside a thermally insulated housing 901, thus reducing a resulting "footprint" of system 900. Housing 901 may include a plurality of loading ports 908 for loading substrates 910. Each substrate may be heated or cooled from at least one side as it is supported by the non-contact support surface, e.g., as described above with reference to FIG. 6.

According to some exemplary embodiments of the invention, system 900 may also include a non-contact substrate handler 912 adapted to enable loading and/or unloading of substrate 910, e.g., as indicated by arrow 914. Handler 912 may be vertically moved as indicated by arrow 916, e.g., using any suitable actuators, to enable loading and/or unloading of substrate 910 to a desired one of thermal chambers 902. Handler 912 and/or housing 901 may include any suitable mechanical, electrical and/or pneumatic drive for vertical indexing and/or for loading or unloading horizontal motion.

It will be appreciated by those skilled in the art, that ports 908 may be relatively narrow, since the use of non-contact support for loading/unloading may obviate the need to implement a bottom holding arm, e.g., used in conventional systems for loading/unloading substrate 910.

Reference is made to FIG. 10*a*, which schematically illustrates an in-line non-contact thermal system 1001 in accordance with an exemplary embodiment of the invention.

System 1001 may include a loading section 1008, e.g., including a PA or PV type non-contact support surface, for loading a substrate 1010, e.g., a wafer or FPD panel. System 1001 may also include a thermal platform 1002 capable of heating or cooling substrate 1010, e.g., as described above. System 1001 may also include any suitable conveying system for conveying substrate 1010 over section 1008 and/or platform 1002, e.g., as indicated by conveyor 1012. System 1001 may additionally include an unloading 1009 section, e.g., including a PA or PV type non-contact support surface, for unloading substrate 1010. The heating/cooling of substrate 1010 may be performed while substrate 1010 is being kept in rest over platform 1002 or while substrate 1010 is traveling over platform 1006.

Reference is made to FIG. 10*b*, which schematically illustrates an in-line non-contact thermal system 1019 in accordance with another exemplary embodiment of the invention. System 1019 may include a loading section and/or an unloading section, e.g., in analogy to the loading and unloading sections described above with reference to FIG. 10*a*. System 1019 may also include a thermal chamber including a top thermal platform 1020 positioned opposite a bottom thermal platform 1022.

Reference is made to FIG. 10*c*, which schematically illustrates an in-line non-contact thermal system 1029 in accordance with yet another exemplary embodiment of the invention.

System 1029 may include a loading section and/or an unloading section, e.g., in analogy to the loading and unloading sections described above with reference to FIG. 10*a*. System 1029 may also include at least two central thermal chambers 1030 and 1032, each of which may be implemented for heating or cooling the substrate.

Figure 11A:
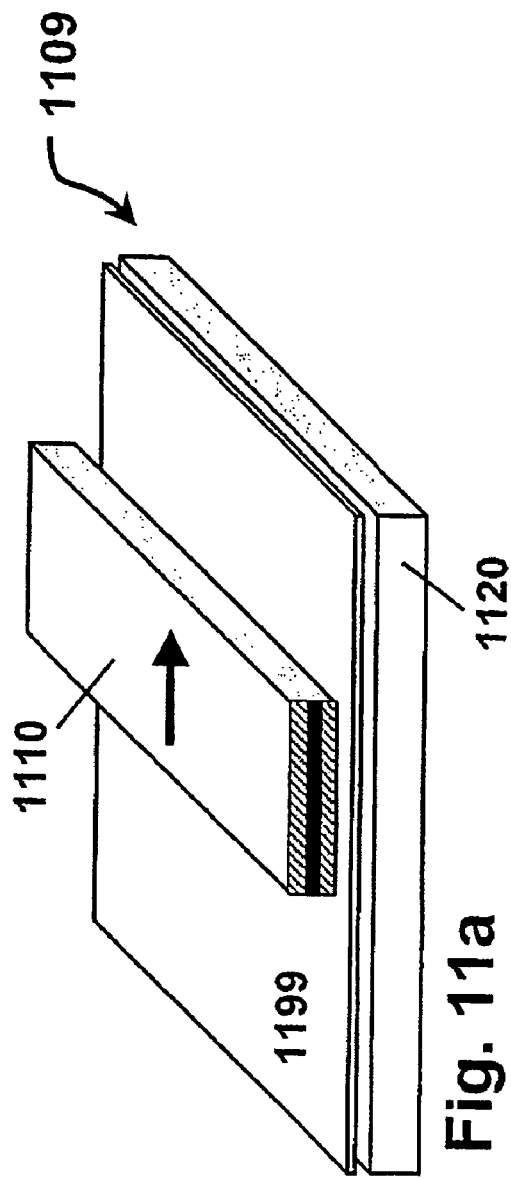
FIGS. 11a-11b are schematic illustrations of optional local thermal treatment where the object is stationary.

Reference is made to FIG. 11*a*, which schematically illustrates an in-line non-contact thermal-treatment apparatus 1109 in accordance with yet another exemplary embodiment of the invention. Apparatus 1109 may include a PA or PV type non-contact support platform 1120, supporting substrate 1199 and a thermal platform 1111 positioned opposite to support platform 1120. Local heating or cooling of substrate 1199 through it's whole width, may be performed by thermal platform 1111, which is longitudinally driven, by any type of mechanical drive, to any required longitudinal position along the substrate 1199.

Figure 11B:
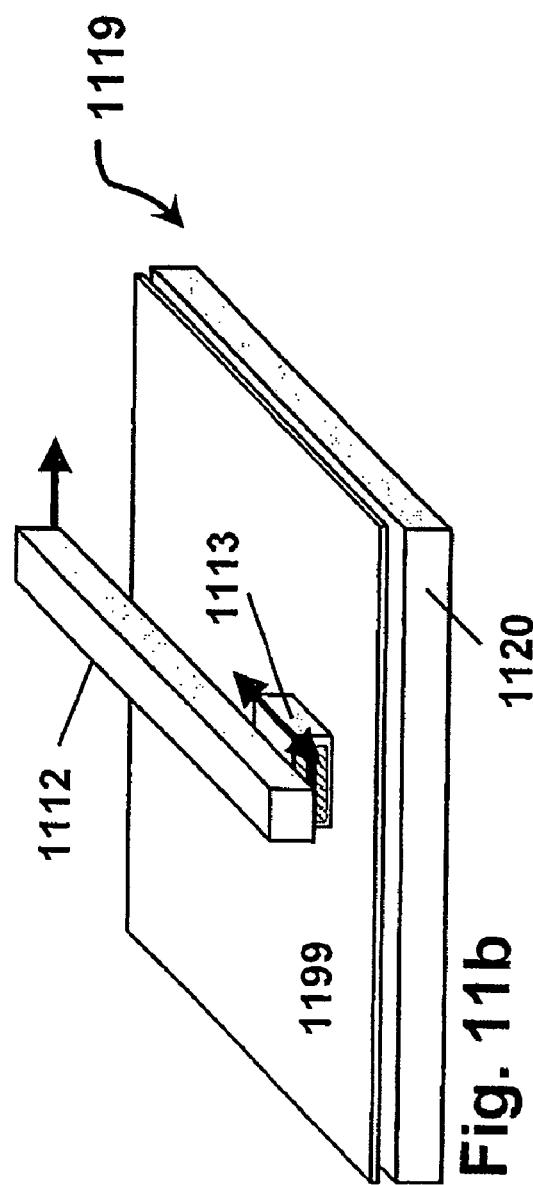

Reference is made to FIG. 11*b*, which schematically illustrates an in-line non-contact thermal-treatment apparatus 1119 in accordance with yet another exemplary embodiment of the invention. Apparatus 1119 may include a PA or PV type non-contact support platform 1120, supporting substrate 1199 and a thermal platform 1113 positioned opposite to support platform 1120. Local heating or cooling of substrates 1199 at any required position may be performed by thermal platform 1113, which is moving laterally on slide 1112, while slide 1112 is moving longitudinally relative to support platform 1120.

Reference is made to FIG. 12a, which schematically illustrates dual sided circular non contact thermal-treatment apparatuses heating or cooling a circular substrate e.g. a SC wafer in accordance with yet another exemplary embodiment of the invention.

Thermal-treatment apparatus as of FIG. 12a includes an upper thermal PV non contact platform 1210, a bottom thermal PV non contact platform 1220, heating or cooling substrate 1299 in between. In one configuration of the system one of the thermal platforms e.g. upper thermal platform 1210 is connected to a mechanical transfer mechanism 1230.

It will be appreciated by those skilled in the art, that one of the thermal platforms of the thermal-treatment apparatus may be a heating thermal platform while the other thermal platform may be a cooling thermal platform while the substrate which is non contact clamped to one of the platforms can be heated or cooled accordingly.

It will be appreciated by those skilled in the art that increasing the distance between the thermal platforms by e.g. lifting upper thermal platform 1210 by transfer mechanism 1230 may reduce thermal cross influence between hot and cold thermal platform on substrate 1299.

It will be appreciated by those skilled in the art that by applying transfer mechanism 1230 relatively fast transfer of substrate is possible between the thermal platforms.

It will be appreciated by those skilled in the art that two sets limiting pins 1240 connected to thermal platform may provide a means of keeping the substrate 1299 in a safe position while it is transferred from one thermal platform to another.

Reference is made to FIG. 12b where yet in another configuration of the system an insulating plate 1250 may be inserted between the thermal platforms 1210 and 1220 while the substrate 1299 is heated or cooled, decreasing further the thermal cross influence between hot and cold thermal platform on substrate 1299. The insulating plate 1250 is removed by mechanical means while the substrate 1299 is transferred between one thermal platform to another.

It will be appreciated by those skilled in the art that insulating plate 1250 may be built of Insulating metal or ceramic heat resistant materials.

In yet another configuration of the system a thermal platform e.g. 1220 may be rotated by mechanical rotating mechanism 1270 thus achieving better temperature uniformity on substrate 1299.

Reference is made to FIG. 12c where yet in another configuration of the system the non contact platform 1220 may have at least three movable landing pins 1260. Landing pins 1260 are in the raised position for supporting substrate 1299, while it is transferred to and from thermal platform 1220 by e.g. end effector type transfer hand supporting substrate from below, and they are lowered into thermal platform 1220 while thermally treating substrate 1299.

Reference is made to FIG. 12d where yet in another configuration of the system the PV non contact thermal platform 1210 is clamping substrate 1299 upside down for thermal treatment. Substrate 1299 can be served to thermal platform 1210 by e.g. end effector type transfer hand supporting substrate from below.

Reference is made to FIG. 12e where yet in another configuration of the system the PV non contact thermal platform 1220 is clamping substrate 1299 for thermal treatment while at least three mechanical rotating rollers drive substrate 1299 in rotation thus achieving better temperature uniformity on substrate 1299.

Although some embodiments of the invention may be described with reference to non-contact support platforms implementing a fluid, it will be appreciated by those skilled in the art that any suitable fluid, for example, water, air, $N_2$, He or Ar, may be implemented by other embodiments of the invention.

It will be appreciated by those skilled in the art that a non-contact thermal system, according to embodiments of the invention, may be implemented to substantially homogeneously modify a temperature of an object, e.g., a SC wafer. The substantially homogeneous temperature spread across the wafer may be related, for example, to the fluid cushion supporting the wafer without contact, which may obviate development of hot or cold spots which may develop on the surface of the wafer if in contact with the supporting surface of the thermal platform, or with any other supporting means, e.g., supporting pins, as are known in the art.

According to embodiments of the invention, the degree of homogeneity of the temperature spread across the wafer may also be related to the type of support platform implemented by the thermal configuration, as explained below.

As described in Reference 1, a PV-type, a PP-type or a PVPV-type support platform may be implemented to achieve relatively high flatness accuracy. Thus, according to some embodiments of the invention, a relatively small difference in the distances between sections of a surface of a wafer and the active surface of the thermal platform may be obtained when implementing a PP-type or a PV-type platform if the wafer has some degree of non-flatness. Thus, the PV-type, the PP-type or PVPV-type support platform may be implemented in order to achieve a relatively homogeneous temperature spread, e.g., a temperature spread having a relatively narrow tolerance.

According to other embodiments of the invention a PA-type support platform may be implemented if a relatively less homogeneous temperature spread, e.g., a temperature spread having a relatively wide tolerance, is required.

According to some embodiments of the invention, the wafer may be rotated with relevance to the facing surface of the non-contact thermal platform in order to obtain a relatively homogeneous temperature spread across the wafer, as described below.

According to some exemplary embodiments, the thermal platform may include mechanical rotation means for rotating the wafer. For example the mechanical rotation means may include a rotating wheel (not shown) capable to clamp the wafer by the edges and rotate the wafer. The rotating wheel may include any rotating wheel formed of suitable material, e.g., as is known in the art.

According to other exemplary embodiments of the invention, the wafer may be rotated using non-contact rotation means, e.g., by injecting fluid jets towards the wafer such that a tangential shear force capable to rotate the wafer is created.

It will be appreciated by those skilled in the art that the use of a non-contact support platform may prevent any damage, which may occur if the supported surface of the wafer is in contact with the supporting platform. For example, the thermal platform implementing the non-contact support surface, in accordance with embodiments of the invention, may prevent any mechanical damage, e.g., scratches or contamination, and/or any slippage related damages.

According to embodiments of the invention, a non-contact thermal platform, e.g., as described above, may implement any suitable aligning and/or mounting means, e.g., for loading and/or unloading a wafer. For example, the non-contact thermal platform may include one or more limit pins, as are known in the art. According to some exemplary embodiments the limit pins may be formed of a thermal-insulating material, as is known in the art. According to other exemplary embodiments, the limit pins may be thermally activated, i.e., heated or cooled, for example, using a heating/cooling device, as is known in the art.

Although some embodiments of the invention described above refer to a object having a round shape, it will be appreciated by those skilled in the art that the devices, systems and/or methods, according to embodiments of the invention, may be analogously implemented for objects having any other shape, e.g., a rectangular shape, or size.

Although some embodiments of the invention described above refer to a wafer, it will be appreciated by those skilled in the art that the devices, systems and/or methods, according to embodiments of the invention, may be analogously implemented for any other objects, e.g., relatively large objects, e.g., Flat Panel Display (FPD) cells.

The invention claimed is:

1. A thermal treatment system comprising at least one apparatus for thermally treating an object, the apparatus comprising:
at least one of a pair of substantially opposite platforms, where
at least one of the platforms having at least one thermal means for heating or cooling of the object; and
at least one of the platforms has fluid-mechanical means for supporting the object without contact, the platform having an active surface comprising at least one of a plurality of basic cells, each basic cell having at least one of a plurality of pressure outlets and at least one of a plurality of fluid-evacuation channels, at least one of the pressure outlets of each basic cell being fluidically connected through a flow restrictor to a high-pressure fluid supply, the pressure outlets providing pressurized fluid for maintaining a fluid-cushion between the object and the active-surface of the platform, the flow restrictor characteristically exhibiting fluidic return spring behavior; each of said at least one of a plurality of fluid-evacuation channels having an inlet and outlet, for locally balancing mass flow for said at least one of a plurality of basic cells.

2. The system of claim 1, wherein the apparatus comprises two platforms for supporting and thermally treating the object in between.

3. The system of claim 2, wherein the two platforms are horizontally oriented, substantially one above the other.

4. The system of claim 1, wherein at least one of the said platforms includes both thermal means and an active-surface for supporting without contact the object.

5. The system of claim 1, wherein said at least one thermal means is integrated in said at least one platform.

6. The system of claim 1, wherein said at least one thermal means comprises a heat exchanger.

7. The system of claim 1, wherein said at least one thermal means comprises an electric heater integrated in said at least one platform.

8. The system of claim 1, wherein said at least one thermal means comprises a radiation heater.

9. The system of claim 1, wherein said at least one thermal means comprises an active cooling unit integrated in said at least one platform.

10. The system of claim 1, further provided with an external heater for heating the fluid.

11. The system of claim 1, further provided with an external cooler for cooling the fluid.

12. The system of claim 1, wherein the apparatus comprises two platforms for supporting and thermally treating the object in between and wherein one platform is provided with a heater and the other platform is provided with a cooler.

13. The system of claim 1, wherein said at least one of a pair of substantially opposite platforms is circular.

14. The system of claim 1, wherein said at least one of a pair of substantially opposite platforms is rectangular.

15. The system of claim 1, wherein the active surface is flat for supporting a flat object.

16. The system of claim 1, wherein the active surface is curved for conformally supporting a non-flat object.

17. The system of claim 1, further provided with a control unit for controlling supply parameters of the fluid-cushion for determining a gap between the object and the active surface of said at least one of two platforms.

18. The system of claim 1, further provided with a control unit for controlling the thermal means.

19. The system of claim 1, further provided with a control unit for mechanically controlling the distance between the platforms.

20. The system of claim 1, further provided with a control unit for controlling the thermal means, for mechanically controlling the distance between the platforms and for controlling supply parameters of the fluid-cushion.

21. The system of claim 1, further provided with at least one sensor for sensing a controllable parameter.

22. The system of claim 21, wherein said at least one sensor comprises a temperature sensor.

23. The system of claim 1, wherein the pressurized fluid is air provided by an air-supply device.

24. The system of claim 1, wherein the pressurized fluid is a gas provided by a gas-supply device.

25. The system of claim 1, wherein the pressurized fluid is a liquid provided by a liquid-supply device.

26. The system of claim 1, wherein the evacuation channels are fluidically connected to a sub-atmospheric pressure reservoir.

27. The system of claim 1, wherein the evacuation channels are connected to a sub-atmospheric source to establish a vacuum pre-load aircushion for supporting without contact the object.

28. The system of claim 1, wherein the evacuation channels are each equipped with a flow restrictor.

29. The system of claim 1, wherein said at least one platform is divided into two or more individually controlled zones where parameters of the fluid-cushion or parameters relating directly to the thermal treatment are controllable locally.

30. The system of claim 29, wherein at least one of the individually controlled zones is located at an edge of said at least one platform.

31. The system of claim 1, further provided with Injecting means of pre-heated fluid at the edge.

32. The system of claim 1, wherein dynamic insulation is provided on at least one edge of said at least one platform.

33. The system of claim 32, wherein the dynamic insulation comprises Injecting or suction means.

34. The system of claim 1, wherein said at least one platform is provided with a peripherally insulating-ring.

35. The system of claim 34, wherein heating means is provide inside the ring.

36. The system of claim 1, wherein said at least one platform is provided with a rotating mechanism.

37. The system of claim 1, wherein said at least one platform is provided with a linear drive unit.

38. The system of claim 1, comprising at least two adjacent apparatuses for serial thermal treatment process of the object.

39. The system of claim 38, wherein an active surface is provided between the apparatuses for transferring the object from one apparatus to the other.

40. The system of claim 1, comprising a plurality of apparatuses in a stacked arrangement for multiple thermal treatment of a plurality of objects.

41. The system of claim 40, further provided with a non-contact feeder.

42. The system of claim 1, further provided with a displacement device for physically changing the distance between active surfaces of opposing platforms.

43. The system of claim 1, further provided with landing pins loading or unloading of the object.

44. The system of claim 1, wherein the area of said at least one platform is roughly the same area as of the object.

45. The system of claim 1, wherein the area said at least one platform is substantially larger than the area of the object.

46. The system of claim 1, wherein the area said at least one platform is substantially smaller than the area of the object.

47. The system of claim 46, further provided with a displacement device for displacing said at least one platform relative to the object.

48. The system of claim 1, further provided with a removable insulating plate for insertion and removal between opposite platforms.

49. The system of claim 1, wherein the apparatus comprises two platforms for supporting and thermally treating the object in between, and wherein the thermal means of the platforms are controllable so as to facilitate a temperature difference between the active surfaces of the platforms.

50. A method for thermally treating an object, the method comprising:
   providing at least one apparatus for thermally treating an object, the apparatus comprising:
   at least one of a pair of substantially opposite platforms, where at least one of the platforms having at least one thermal means for heating or cooling of the object; and
   at least one of the platforms has fluid-mechanical means for supporting the object without contact, the platform having an active surface comprising at least one of a plurality of basic cells, each basic cell having at least one of a plurality of pressure outlets and at least one of a plurality of fluid-evacuation channels at least one of the pressure outlets of each basic cell being fluidically connected through a flow restrictor to a high-pressure fluid supply, the pressure outlets providing pressurized fluid for maintaining a fluid-cushion between the object and the active-surface of the platform, the flow restrictor characteristically exhibiting fluidic return spring behavior; each of said at least one of a plurality of fluid-evacuation channels having an inlet and outlet, for locally balancing mass flow for said at least one of a plurality of basic cells:
   placing the object adjacent to an active surface and administering it a thermal treatment.

51. The method of claim 50, wherein the apparatus comprises two substantially opposite platforms, and wherein the object is supported or treated by one platform kept at a first temperature during a predetermined period of time and then transferred by non-contact mechanical or aero-mechanical means to be supported or treated by the other platform, kept at a second temperature.

52. The method of claim 51, wherein the opposite platforms are positioned substantially one above the other.

53. The method of claim 50, wherein the fluid cushion maintains a gap between the active surface and the object that is less than 0.5 mm.

54. The method of claim 50, wherein the fluid cushion maintains a gap between the active surface and the object that is less than 0.1 mm.

55. The method of claim 50, wherein the fluid cushion maintains a gap between the active surface and the object that is less than 0.02 mm.

56. The method of claim 50, wherein the fluid cushion maintains a gap between the active surface and the object that is controllable by controlling pressure of the fluid supply and pressure in the evacuation channels.

\* \* \* \* \*